United States Patent [19]

Asai et al.

[11] Patent Number: 5,873,691

[45] Date of Patent: *Feb. 23, 1999

[54] ELECTRONIC-COMPONENT SUPPLYING SYSTEM

[75] Inventors: Koichi Asai, Nagoya; Yasuo Muto, Chiryu; Yukio Ueno, Nagoya, all of Japan

[73] Assignee: Fuji Machine Mfg. Co., Ltd., Chiryu, Japan

[*] Notice: This patent issued on a continued prosecution application filed under 37 CFR 1.53(d), and is subject to the twenty year patent term provisions of 35 U.S.C. 154(a)(2).

[21] Appl. No.: 637,380

[22] Filed: Apr. 24, 1996

[30] Foreign Application Priority Data

May 11, 1995 [JP] Japan .................................. 7-113167

[51] Int. Cl.$^6$ ..................................................... H05K 3/30
[52] U.S. Cl. ............................ 414/416; 29/740; 156/584
[58] Field of Search ..................................... 414/403, 416, 414/225, 797; 29/740; 221/25, 72, 73, 87; 156/584, 344

[56] References Cited

U.S. PATENT DOCUMENTS

| | | | |
|---|---|---|---|
| 4,952,113 | 8/1990 | Fujioka | 414/416 |
| 5,191,693 | 3/1993 | Umetsu | 414/416 X |
| 5,299,902 | 4/1994 | Fujiwara et al. | 414/403 X |
| 5,329,692 | 7/1994 | Kashiwagi | 29/740 |
| 5,419,802 | 5/1995 | Nakatsuka et al. | 156/584 |
| 5,515,600 | 5/1996 | Iwasaki et al. | 29/740 |
| 5,553,376 | 9/1996 | Solanki et al. | 29/740 X |
| 5,658,122 | 8/1997 | Ohashi et al. | 414/749 |
| 5,695,309 | 12/1997 | Kondo et al. | 414/416 |

FOREIGN PATENT DOCUMENTS 3-93238 A    4/1991    Japan ...................................... 29/740

Primary Examiner—Stephen T. Gordon
Attorney, Agent, or Firm—Oliff & Berridge, PLC

[57] ABSTRACT

An electronic-component supplying system including electronic-component supplying cartridges each of which includes a cartridge frame, an electronic-component holder which holds electronic components and which includes a connection portion connected to a connection portion of the cartridge frame, and an electronic-component feeder which feeds each of the electronic components from the holder to an electronic-component supplying position distant from the connection portion of the cartridge frame, a support member which supports the respective cartridge frames of the supplying cartridges such that the respective electronic-component supplying positions on the cartridge frames are aligned with each other in a predetermined direction, and an engaging device which is provided between the support member and an engageable portion of the holder of each cartridge, the engageable portion of the holder being distant from the connection portion thereof, the engaging device being engageable with the engageable portion of the holder such that the engageable portion is substantially immovable relative to the support member in the predetermined direction.

25 Claims, 20 Drawing Sheets

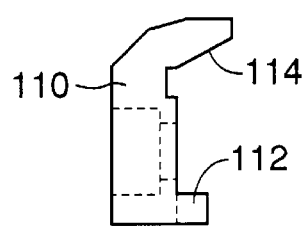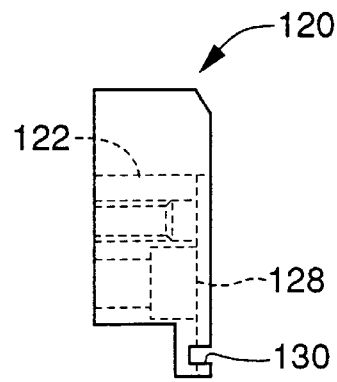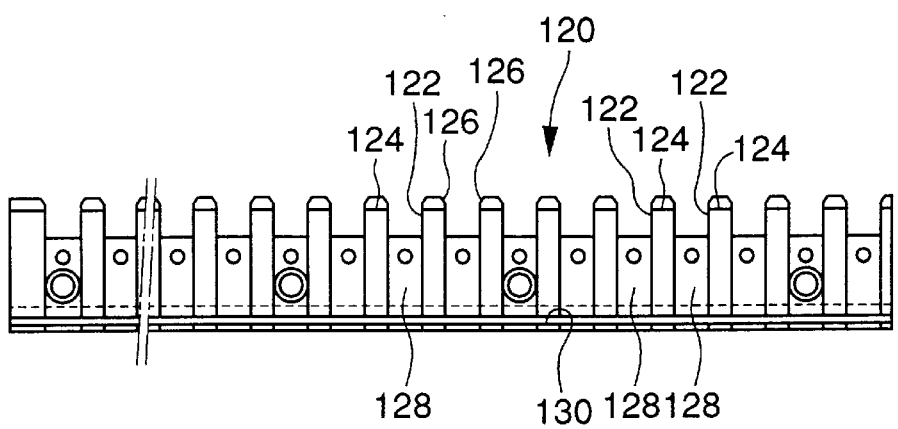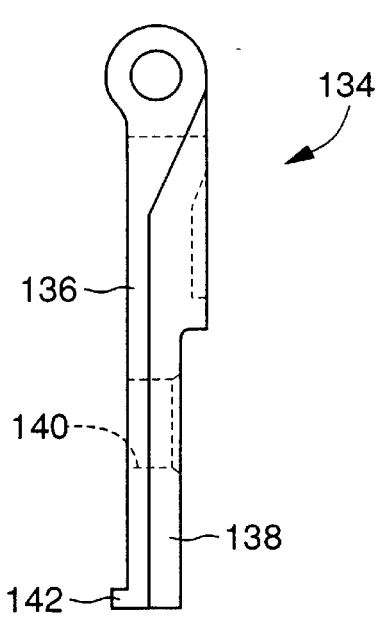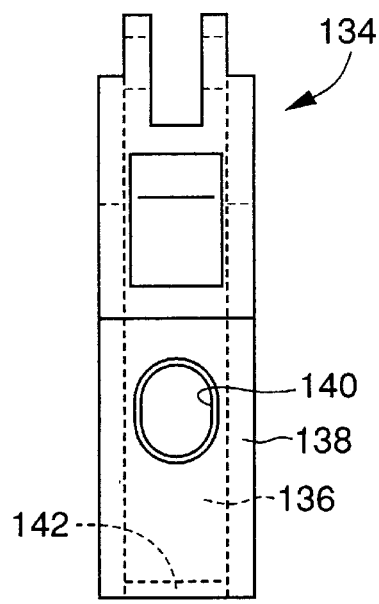

ELECTRONIC-COMPONENT SUPPLYING SYSTEM

BACKGROUND OF THE INVENTION

1. Field of the Invention

The present invention relates to an electronic-component supplying system including electronic-component supplying cartridges and a cartridge support member and in particular to improvements in the technique with which each cartridge is supported by the support member.

2. Related Art Statement

There is known an electronic-component supplying system which employs a plurality of electronic-component supplying cartridges, each for supplying electronic components to an electronic-component mounting device. The supplying system includes (a) a plurality of electronic-component supplying cartridges each of which includes a cartridge frame, an electronic-component holder which holds a number of electronic components and which includes a connection portion connected to a connection portion of the cartridge frame, and an electronic-component feeder which feeds each of the electronic components from the holder to an electronic-component supplying position distant from the connection portion of the cartridge frame, and (b) a support member which supports the respective cartridge frames of the supplying cartridges such that the respective electronic-component supplying positions on the cartridge frames are aligned with each other in a predetermined direction, e.g., width-wise direction of each cartridge.

In the above-identified electronic-component supplying system, the cartridge frame and electronic-component holder of each cartridge are supported by the support member. The support member has a support surface on which each cartridge is supported, and has a pair of positioning pins distant from each other in a direction parallel to an electronic-component feeding direction, on the support surface. The cartridge frame of each cartridge has a pair of positioning holes corresponding to the pair of pins of the support member. With the pins fitting in the holes, the cartridge frame is positioned relative to the support member. In addition, the support member has a number of grooves at positions thereof each corresponding to an end portion of the electronic-component holder opposite to the connection portion thereof connected to the connection portion of the cartridge frame of each cartridge. The grooves are formed at a regular interval of distance in the width-wise direction and each extend parallel to the feeding direction. A projection projects from the end portion of the holder and extends parallel to the feeding direction. With the support portion fitting in one of the grooves, the movement of the holder in the width-wise direction is restricted by a pair of walls defining that groove.

However, different electronic-component holders, i.e., different electronic-component supplying cartridges may have different projections having different thickness values, for example, because the projections are formed of different plates. In the case where a holder having a projection with a thickness smaller than the width of each groove of the support member, is attached to the support member, some space is left between the projection and the groove-defining walls, resulting in causing the projection or the holder to vibrate in the width-wise direction. Even if the cartridge frame to which the holder is connected does not vibrate relative to the support member, the holder elastically deforms and vibrates. Since holders are made large to accommodate an increased number of electronic components and are formed of a thin material to reduce the weight thereof, and since the sum of masses of the electronic components mounts to a lot, the holders easily deform and vibrate.

In particular, in the case where the support member is movable in the width-wise direction to locate a selected one of the cartridges at an electronic-component taking-up position where each electronic component is taken up and supplied to the electronic-component mounting device, the electronic-component holder of the selected cartridge vibrates because of the inertia force exerted thereto. The vibration of the holder is transmitted to the cartridge frame, so that the electronic-component supplying position on the cartridge frame changes relative to the electronic-component taking-up position of the supplying system as a whole. Thus, the accuracy of positioning of the supplying position of each cartridge is lowered and, in an extreme case, each cartridge may fail to supply an electronic component to the mounting device.

SUMMARY OF THE INVENTION

It is therefore a first object of the present invention to provide an electronic-component supplying system which includes a plurality of electronic-component supplying cartridges and a support member and which effectively prevents the vibration of each cartridge relative to the support member.

It is a second object of the present invention to provide an electronic-component supplying cartridge which is adapted to be supported by a support member and which is effectively prevented from vibrating relative to the support member.

The first object may be achieved according to a first aspect of the present invention, which provides an electronic-component supplying system comprising a plurality of electronic-component supplying cartridges each of which includes a cartridge frame, an electronic-component holder which holds a plurality of electronic components and which includes a connection portion connected to a connection portion of the cartridge frame, and an electronic-component feeder which feeds each of the electronic components from the holder to an electronic-component supplying position distant from the connection portion of the cartridge frame, a support member which supports the respective cartridge frames of the supplying cartridges such that the respective electronic-component supplying positions on the cartridge frames are aligned with each other in a predetermined direction, and at least one engaging device which is provided between the support member and at least one engageable portion of the holder of the each cartridge, the engageable portion of the holder being distant from the connection portion thereof, the engaging device being engageable with the engageable portion of the holder such that the engageable portion is substantially immovable relative to the support member in the predetermined direction.

In the electronic-component supplying system constructed as described above, when each of the electronic-component supplying cartridges is attached to the support member, the engageable portion of the electronic-component holder of each cartridge is engaged with the engaging device, such that the engageable portion is substantially immovable relative to the support member in the predetermined direction, i.e., width-wise direction of each cartridge. In this condition, the engageable portion may elastically be deformed. Accordingly, even though the support member may be moved in the width-wise direction, each cartridge does not vibrate. The holder may have, as the engageable portion thereof, an end portion thereof opposite to the connection portion thereof, or an intermediate portion thereof between the connection and end portions thereof. It is preferred that the intermediate portion as the engageable portion be located between the end portion of the holder and a middle portion of the same in an electronic-component feeding direction of each cartridge. Most preferably, the engageable portion is located adjacent to the middle portion, on the side of the end portion, because the distance between the engageable and connection portions takes a minimum and the vibration of the portion between the engageable and connection portions is restricted. In the present supplying system, the vibration of the holder in the predetermined direction is effectively restricted. In addition, the dislocation of the electronic-component supplying position on the cartridge frame due to the transmission thereto of vibration of the holder is effectively prevented.

In a preferred embodiment in accordance with the first aspect of the invention, the engaging device comprises two engageable members which are engageable with opposite two surfaces in the predetermined direction of the engageable portion of the holder of the each cartridge, respectively, one of the two engageable members comprising a movable member which is movable relative to the support member in the predetermined direction, the engaging device further comprising a biasing member which provides a biasing force to bias the movable member toward the engageable portion of the holder, the other of the two engageable members comprising a stopper surface which is fixed to the support member and which stops a movement of the engageable portion of the holder due to the biasing force of the biasing member applied thereto via the movable member and thereby defines a limit of the movement of the engageable portion. When each cartridge is attached to the support member, the engageable portion of the holder is moved into between the movable member and the stopper surface, thereby moving the movable member away from the stopper surface against the biasing force of the biasing member. After the attachment of the cartridge to the support member, the engageable portion of the holder is pressed against the stopper surface because of the biasing force of the biasing member applied thereto via the movable member, so that the holder is supported on the support member substantially immovably relative thereto. In the present embodiment, the engaging device can engage, with high reliability, each of respective engageable portions of different holders or cartridges, even if those engageable portions may have different thickness values.

According to another feature of the first aspect of the invention, the movable member comprises a rotatable member including opposite two end portions and an intermediate portion which is formed of an elastic material and which is supported by the support member such that the intermediate portion is rotatable about an axis line substantially perpendicular to the predetermined direction, the two end portions of the rotatable member providing a first and a second engageable portion, the intermediate portion of the rotatable member being elastically deformed when the first and second engageable portions engage the engageable portion of the holder, the biasing member comprising the intermediate portion of the rotatable member. When each cartridge is attached to the support member, the engageable portion of the holder is moved into between the first and second engageable portions and the stopper surface, thereby rotating the rotatable member and elastically deforming the intermediate portion of the rotatable member. After the attachment of the cartridge to the support member, the engageable portion of the holder is pressed against the stopper surface because of the biasing force of the elastically deformed intermediate portion applied thereto via the first and second engageable portions, so that the holder is prevented from moving in the predetermined direction. The axis line of the intermediate portion of the rotatable member may be either parallel to, or perpendicular to, the electronic-component feeding direction, or may even be inclined with respect to the feeding direction, so long as the axis line is located in a plane perpendicular to the feeding direction. In the present embodiment, the rotatable member also functions as the biasing member, thereby simplifying the construction of the engaging device. In addition, when the rotatable member engages the engageable portion of the holder, the rotatable member is made unable to rotate any more, because the first and second engageable portions are held in engagement with the rotatable member and the intermediate portion is elastically deformed. Thus, it is not necessary to employ an exclusive member for stopping the rotation of the rotatable member.

According to a preferred feature of the first aspect of the invention, each of the first and second engageable portions comprises a roller which is rotatable about an axis line substantially perpendicular to both the predetermined direction and a direction in which the holder of the each cartridge is moved relative to the support member when the each cartridge is attached to the support member. In this case, the resistance to the movement of the engageable portion of the holder into between the rotatable member and the stop surface, is minimized. Thus, the durability of the holder is improved.

According to another feature of the first aspect of the invention, the movable member comprises a rotatable member which is supported by the support member such that the rotatable member is rotatable about an axis line substantially perpendicular to the predetermined direction. In the present invention, it is not essentially required that the rotatable member be formed of an elastic material, that is, the rotatable member may be formed of a non-elastic material. In the last case, an exclusive biasing member may be employed. In addition, it is not essential that the rotatable member be provided with two engageable portions, that is, the rotatable member may be provided with a single engageable portion only.

According to another feature of the first aspect of the invention, the movable member comprises a rotatable member including an elastic portion which is formed of an elastic material and which is supported by the support member such that the elastic portion is rotatable about an axis line substantially perpendicular to the predetermined direction, the rotatable member further including a first and a second engageable portion distant from the elastic portion, the elastic portion being elastically deformed when the first engageable portion engages the engageable portion of the holder and the second engageable portion engages a stopper portion of the support member. The rotatable member may have, as the elastic portion, either an intermediate portion thereof or one of opposite two end portions thereof. In the former case, the first and second engageable portions may be provided by opposite two end portions of the rotatable member, respectively. In the latter case, the first and second engageable portions may be provided by the other of the two end portions and an intermediate portion of the rotatable member, respectively.

According to another feature of the first aspect of the invention, the movable member comprises a rotatable member which is supported by the support member such that the rotatable member is rotatable about an axis line substantially perpendicular to the predetermined direction, the rotatable member including an engageable end portion which is engageable with the engageable portion of the holder, the biasing member comprising an elastic member which is provided between the rotatable member and the support member and which elastically presses the engageable end portion of the rotatable member against the engageable portion of the holder when the engageable end portion of the rotatable member engages the engageable portion of the holder.

According to another feature of the first aspect of the invention, the movable member comprises at least one linearly movable member which is supported by the support member such that the linearly movable member is movable substantially linearly in the predetermined direction. The movable member may comprise either a single linearly movable member or a plurality of linearly movable members. In either case, the single linearly movable member, or each of the linearly movable members may have a plurality of engageable portions for pressing, with higher stability, the engageable portion of the holder against the stop surface.

According to another feature of the first aspect of the invention, the engaging device comprises an engageable groove which extends in a direction substantially perpendicular to the predetermined direction and which is engageable with the engageable portion of the holder of the each cartridge, the engageable groove being formed in a portion of the support member which corresponds to the engageable portion of the holder distant from the connection portion thereof connected to the connection portion of the cartridge frame of the each cartridge.

According to another feature of the first aspect of the invention, the engaging device comprises two wall members which cooperate with each other to define the engageable groove, the movable member being supported by one of the two wall members, the stopper surface being provided on the other of the two wall members. When the holder of each cartridge is attached to the support member, the engageable portion of the holder is engaged with the engageable groove and is pressed against the stopper surface provided on the other wall member because of the biasing force of the biasing member applied thereto via the movable member. Thus, the holder is effectively prevented from moving in the predetermined direction.

According to another feature of the first aspect of the invention, the engaging device comprises two movable members which are provided, outside the engageable groove, adjacent to opposite two ends of the engageable groove, respectively. In this case, the engageable portion of the holder is pressed against the stopper surface, by the two movable members provided on both sides of the engageable groove. Thus, a uniform pressing force is applied to the engageable portion of the holder, resulting in attaching the holder to the support member such that the holder takes an attitude parallel to the electronic-component feeding direction.

According to another feature of the first aspect of the invention, at least one of the wall members has a hole which opens in the engageable groove and which accommodates the movable member and the biasing member. With this arrangement, the amount of projection of the movable member from the support member into the engageable groove is reduced or zeroed. In the latter case, the biasing member biases the movable member into the engageable groove. The movable member is protected by the support member, and the operator is not interfered with by the movable member.

According to another feature of the first aspect of the invention, the engageable portion of the holder has an engageable surface which is engageable with the movable member and which is inclined with respect to a direction in which the movable member is biased by the biasing member, and a direction of the inclination of the engageable surface is selected such that when the movable member engages the engageable surface, the biasing force of the biasing member provides, via the movable member and the engageable surface, a force to press the each cartridge against the support member in a direction substantially perpendicular to the predetermined direction. In this case, only if the movable member engages the engageable portion of the holder, the movement of the holder in the predetermined direction is inhibited, and the moving up of the cartridge from the support member is prevented. Thus, an exclusive cartridge-moving-up preventing device can be omitted, and the overall construction of the electronic-component supplying system is simplified. The direction in which the movable member is biased by the biasing member may be a direction substantially parallel to the electronic-component feeding direction.

According to another feature of the first aspect of the invention, the engaging device comprises an engageable projection which is provided on one of the support member and the each cartridge and which extends in a direction in which the holder of the each cartridge is moved relative to the support member when the each cartridge is attached to the support member, and comprises an engageable recess which is provided in the other of the support member and the each cartridge and which is engageable with the engageable projection such that the engageable projection and recess are substantially immovable relative to each other in the predetermined direction. It is preferred in view of easiness of production that the engageable projection be provided by a pin having a circular cross section. It is also preferred that the projection include a tapered end portion which functions as a guide for guiding the remaining portion of the projection into the engageable recess, when the projection is engaged with the recess. In addition, it is possible that the recess be provided with a guide for guiding the movement of the projection thereinto.

According to another feature of the first aspect of the invention, the engageable recess of the engaging device comprises an elongate hole which is elongate in a direction perpendicular to the predetermined direction. The present supplying system permits, when each cartridge is attached to the support member, the movement of the cartridge relative to the support member in the direction perpendicular to the predetermined direction. Accordingly, the operator can easily attach each cartridge to the support member. In particular, in the case where each cartridge is adapted to be pressed against the support member owing to the biasing force applied to the cartridge in the electronic-component feeding direction, the relative movement of the projection and the elongate hole is permitted and accordingly the movement of the cartridge is permitted. In the case where the holder of each cartridge has the elongate hole and the support member has the projection, the operator can easily attach the holder to the support member, i.e., engage the hole with the projection while viewing the projection through the hole. The above-indicated direction perpendicular to the predetermined direction may be parallel to the electronic-component feeding direction, or otherwise may be perpendicular to, or be inclined with respect to, the feeding direction. In the latter cases, the projection projects in a direction which is perpendicular to the predetermined direction and in which the projection can engage the elongate hole. For example, when the operator attaches each cartridge to the support member by moving the former relative to the latter from the rear side of the latter, such that the cartridge takes an attitude substantially parallel to the electronic-component feeding direction, the projection and the elongate hole can easily be engaged with each other.

According to another feature of the first aspect of the invention, the supplying system comprises a plurality of engaging devices which are provided at a plurality of positions, respectively, which are distant from each other on the support member in a direction parallel to a direction in which the feeder of the each cartridge feeds the each electronic component from the holder thereof to the electronic-component supplying position on the cartridge frame thereof. In this case, the movement of the holder in the predetermined direction is prevented by the plurality of engaging devices provided at the plurality of positions. Therefore, the vibration of the holder due to the elastic deformation thereof is more effectively restricted.

According to another feature of the first aspect of the invention, the supplying system comprises a plurality of engaging devices which are provided at a plurality of positions, respectively, which are distant from each other on the support member in a direction perpendicular to a direction in which the feeder of the each cartridge feeds the each electronic component from the holder thereof to the electronic-component supplying position on the cartridge frame thereof. In this case, the vibration of the holder due to the rotation thereof about an axis line parallel to the electronic-component feeding direction is effectively restricted. In the case where the supplying system comprises a plurality of engaging devices provided at a plurality of positions distant from each other in the direction perpendicular to the electronic-component feeding direction and a plurality of engaging devices provided at a plurality of positions distant from each other in the direction parallel to the feeding direction, the vibration of the holder is much more effectively restricted.

According to another feature of the first aspect of the invention, the holder of the each cartridge comprises a reel holder which holds a tape reel around which a carrier tape carrying the electronic components at a regular interval of distance is wound, such that the tape reel is rotatable about an axis line parallel to the predetermined direction.

According to another feature of the first aspect of the invention, the supplying system further comprises a moving device which moves the support member supporting the cartridges, in the predetermined direction.

According to another feature of the first aspect of the invention, the moving device comprises means for moving the support member in the predetermined direction perpendicular to a direction in which the feeder of the each cartridge feeds the each electronic component from the holder thereof to the electronic-component supplying position on the cartridge frame thereof. Alternatively, the moving device may comprise means for moving the support member in the predetermined direction which is inclined with respect to the electronic-component feeding direction. In the latter case, the cartridges are attached to the support member such that each cartridge takes an attitude inclined with respect to the predetermined direction. In the latter case, therefore, the support member may have a smaller dimension in a direction perpendicular to the predetermined direction, than a dimension which the support member has in the former case.

According to another feature of the first aspect of the invention, the cartridge frame of the each cartridge comprises one of an engageable projection and an engageable groove which is engageable with the engageable projection and extends in a direction perpendicular to the predetermined direction, and the support member comprises the other of the engageable projection and the engageable groove.

According to another feature of the first aspect of the invention, the supplying system further comprises a preventing device which prevents the cartridge frame of the each cartridge from moving away from the support member.

The second object may be achieved according to a second aspect of the present invention, which provides an electronic-component supplying cartridge comprising a cartridge frame, an electronic-component holder which holds a plurality of electronic components and which includes a connection portion connected to a connection portion of the cartridge frame, an electronic-component feeder which feeds each of the electronic components from the holder to an electronic-component supplying position distant from the connection portion of the cartridge frame, and the holder including at least one engageable portion distant from the connection portion thereof, the engageable portion being engageable with a support member such that the engageable portion is substantially immovable relative to the support member in a predetermined direction.

In the electronic-component supplying cartridge constructed as described above, the engageable portion of the holder is engageable with the support member such that the engageable portion is substantially immovable relative to the support member in a predetermined direction, e.g., widthwise direction of each cartridge. Thus, the vibration of the holder in the predetermined direction is effectively prevented, even when the support member is moved in the predetermined direction.

According to a preferred feature of the second aspect of the invention, the engageable portion of the holder comprises a flat portion having a uniform thickness, the flat portion having two surfaces which are opposite to each other in the predetermined direction. The flat portion may be formed of an elastic material, and may elastically deformed when being engaged with, e.g., an engageable groove formed in the support member.

According to another feature of the second aspect of the invention, the engageable portion of the holder comprises an inclined surface which is inclined with respect to one of the two surfaces of the flat portion.

According to another feature of the second aspect of the invention, the engageable portion of the holder comprises one of (a) an engageable projection which extends in a direction in which the holder is moved relative to the support member when the supplying cartridge is attached to the support member and (b) an engageable recess which is engageable with the engageable projection such that the engageable projection and recess are substantially immovable relative to each other and relative to the support member in the predetermined direction.

According to another feature of the second aspect of the invention, the engageable portion of the holder comprises an engageable elongate hole which is elongate in a direction perpendicular to the predetermined direction.

According to another feature of the second aspect of the invention, the holder comprises a plurality of engageable portions which are distant from each other in a direction perpendicular to the predetermined direction.

According to another feature of the second aspect of the invention, the cartridge frame comprises one of an engageable projection and an engageable groove which is engageable with the engageable projection and extends in a direction perpendicular to the predetermined direction.

According to another feature of the second aspect of the invention, the cartridge further comprising a preventing device which prevents the cartridge frame from moving away from the support member.

According to a third aspect of the present invention, there is provided an electronic-component supplying cartridge comprising a cartridge frame adapted to be supported by a support member, an electronic-component holder including a reel holder which holds a tape reel around which a carrier tape carrying a plurality of electronic components at a regular interval of distance is wound, such that the tape reel is rotatable about an axis line parallel to a predetermined direction, the reel holder including a connection portion connected to a connection portion of the cartridge frame, an electronic-component feeder which feeds each of the electronic components from the tape reel to an electronic-component supplying position distant from the connection portion of the cartridge frame in a direction perpendicular to the predetermined direction, the cartridge frame including one of an engageable projection and an engageable groove which is engageable with the engageable projection and which extends in the direction perpendicular to the predetermined direction, a preventing device which prevents the cartridge frame from moving away from the support member including the other of the engageable projection and groove, and the reel holder including at least one engageable portion which is distant from the connection portion thereof in the direction perpendicular to the predetermined direction, the engageable portion being engageable with the support member such that the engageable portion is substantially immovable relative to the support member in the predetermined direction.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 7 is a different side view of the stopper plate of FIG. 6;

FIG. 8 is a side view of a cartridge positioning plate which is fixed to the support table of FIG. 3;

FIG. 9 is a different side view of the positioning plate of FIG. 8;

FIG. 10 is a side view of the engaging lever which is provided on the support table of FIG. 3;

FIG. 11 is a different side view of the engaging lever of FIG. 10;

DETAILED DESCRIPTION OF THE PREFERRED EMBODIMENTS

Figure 1:
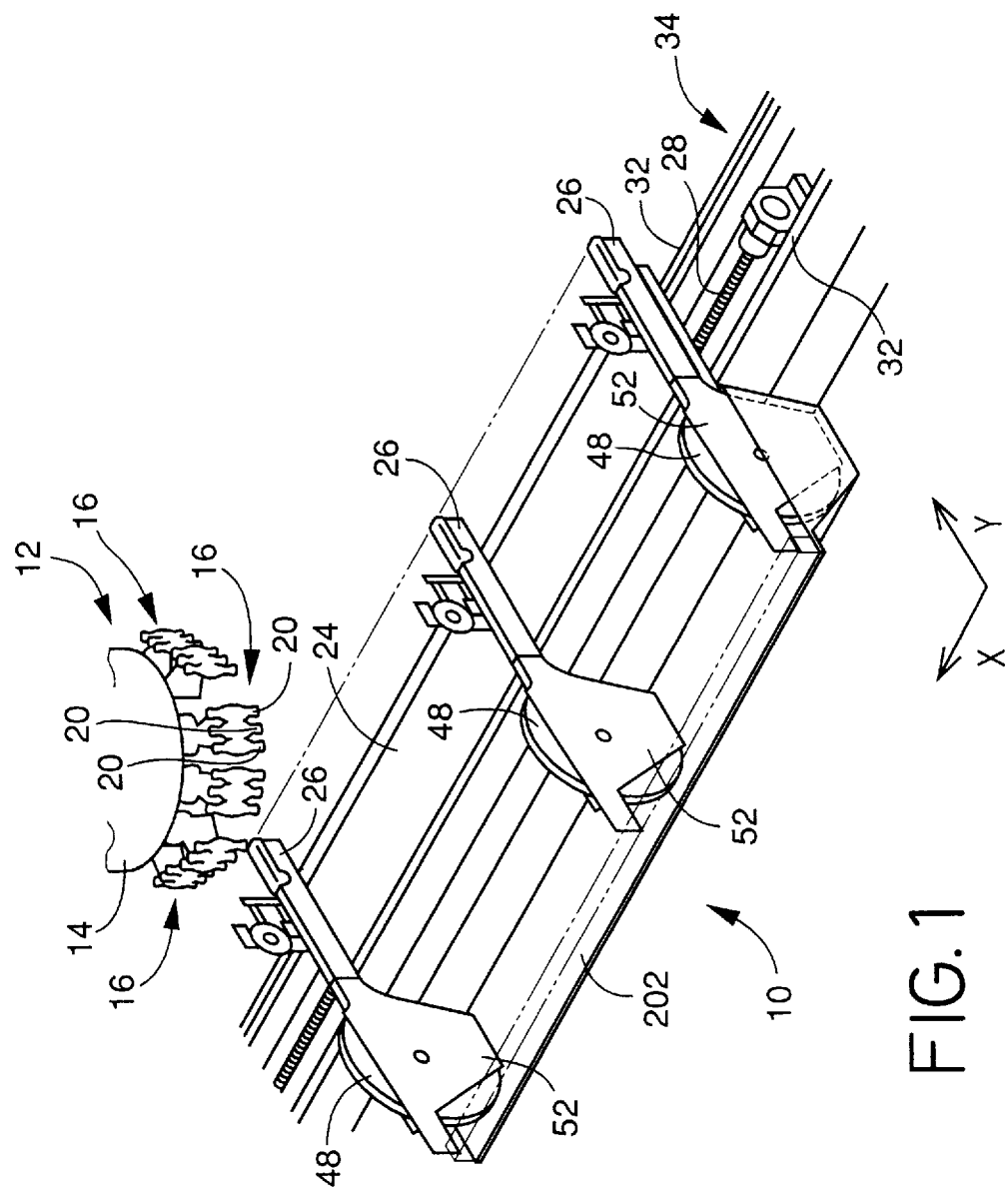
FIG. 1 is a perspective view of an electronic-component supplying system embodying the present invention, and an electronic-component mounting device for use with the supplying system.

Referring first to FIG. 1, there is shown an electronic-component supplying system 10 to which the present invention is applied. Reference numeral 12 designates an electronic-component mounting device which receives each of a plurality of electronic components from the supplying system 10 and mounts each component on an object such as a printed circuit board (PCB).

The mounting device 12 includes an index table 14 which is intermittently rotatable about a vertical axis line. The index table 14 supports twelve component-suction units 16, and is intermittently rotated by an intermittent-rotation drive device provided by a cam, a cam follower, a rotation axis member (not shown), and an index servomotor 18 (FIG. 21) for rotating the cam, so that each of the twelve suction units 16 is sequentially moved to a component taking-up position, a component-posture detecting position, a component-posture correcting position, and a component mounting position. Each suction unit 16 has three component-suction heads 20 each of which is selectively positioned or indexed at an operative position where the selected suction head 20 takes up, by air suction, each electronic component from the supplying system 10.

The supplying system 10 includes a number of electronic-component supplying cartridges 26 each of which is attachable to a support table 24 as a support member which is movable in one direction parallel to the horizontal plane (hereinafter, referred to as the X direction). The support table 24 is moved by being guided by a pair of guide rails 32, 32 when a ball screw 28 is rotated by an X-direction servomotor 30 (FIG. 21), so that a desired one of the supplying cartridges 26 is moved to the component taking-up position of the mounting device 12. The ball screw 28, X-direction servomotor 30, guide rails 32, etc. cooperate with one another to provide a cartridge moving device 34.

Figure 2:
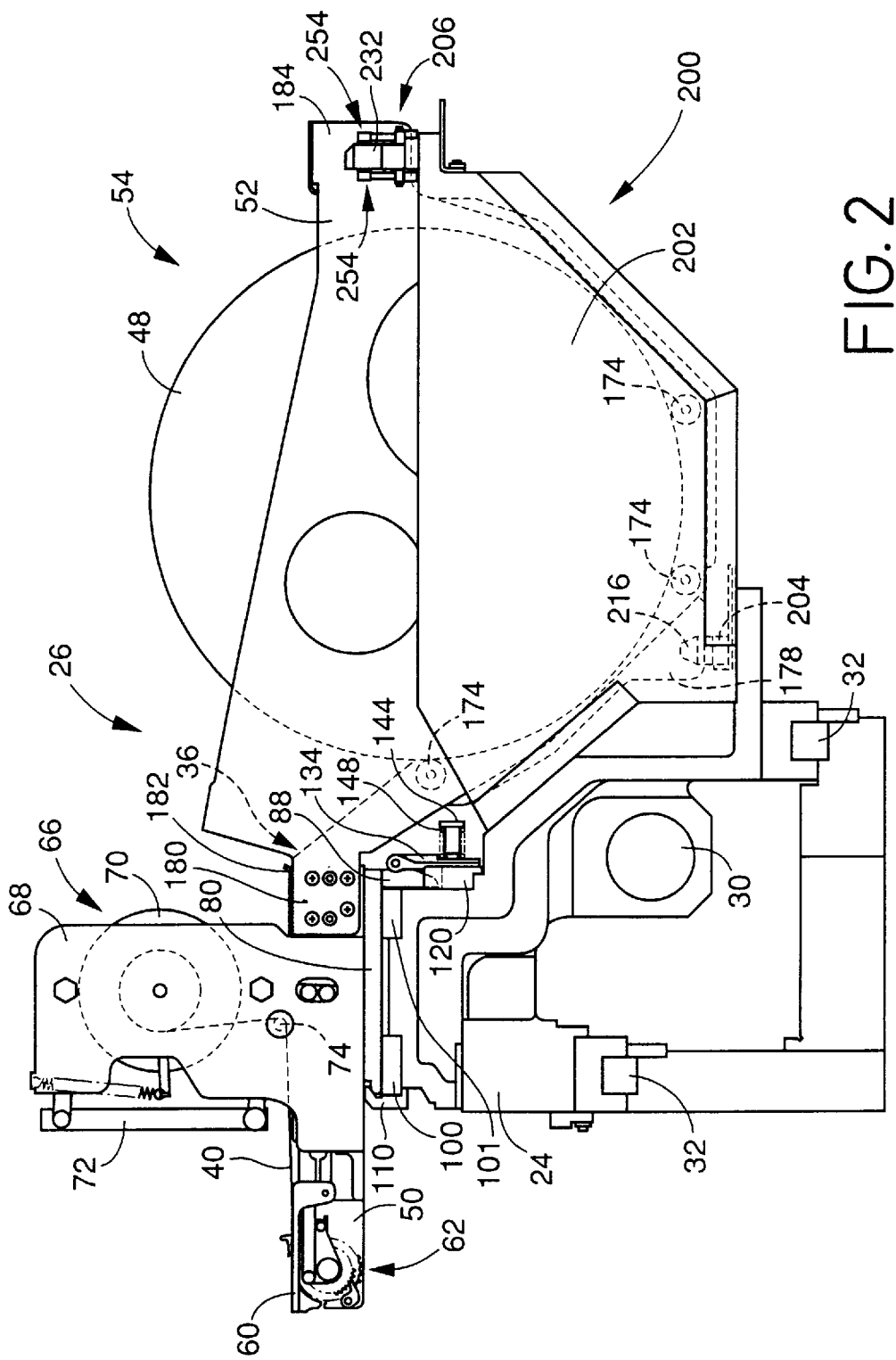
FIG. 2 is a side view of the supplying system of FIG. 1.

Each supplying cartridge 26 supplies electronic components which are carried by a carrier tape 36. The carrier tape 36 includes an electronic-component accommodating tape (not shown) having a number of pockets in which electronic components are accommodated, respectively, and a cover film 40 which covers respective openings of the pockets. As shown in FIG. 2, the carrier tape 36 is wound around a tape reel 48. The tape reel 48 is held by a reel holder 52 which is fixed to a rear end portion of a cartridge frame 50 which is remote from the mounting device 12. The reel holder 52 provides an electronic-component holder 54 which will be described in detail later.

The cartridge frame 50 has a generally elongate and plate-like configuration, and is attachable to the support table 24 such that a longitudinal and a thickness-wise direction of the frame 50 are parallel to the horizontal plane. The carrier tape 36 is supported on a top face of the cartridge frame 50, and is covered by a cover member 60 shown in FIG. 2, so that the tape 36 is intermittently fed forward at a predetermined pitch by a tape feeder 62 in the longitudinal direction of the frame 50 as a Y direction perpendicular to the X direction. Hereinafter, the longitudinal direction of the cartridge frame 50 will be referred to, if appropriate, as the frontward or rearward direction of the supplying cartridge 26, and the thickness-wise direction of the same 50 will be referred to, if appropriate, as the leftward or rightward direction of the cartridge 26. The frontward direction of the cartridge 26 corresponds to the tape feeding direction of the same 26.

The tape feeder 62 intermittently feeds forward the carrier tape 36 together with the cover member 60, and moves backward the cover member 60 only. While the cover member 60 is moved backward, the tape feeder 62 does not feed the carrier tape 36 and prepares for the next intermittent feeding of the tape 36 (i.e., the tape feeder 62 causes a ratchet pawl to move over the teeth of a ratchet wheel).

A cover-film take-up device 66 is also detachably attached via a bracket 68 to the cartridge frame 50. The take-up device 66 includes a take-up reel 70 and is designed such that when the carrier tape 36 is fed forward, the reel 70 does not rotate or take up the cover film 40 and when the tape feeder 62 prepares for each intermittent tape feeding, the reel 70 rotates to take up the film 40.

The tape feeder 62 and the film take-up device 66 are driven by a drive device which utilizes the index servomotor 18 as a drive source therefor. The rotation of the servomotor 18 is converted into upward and downward movements of a movable member (not shown) by a motion converting mechanism provided by a cam, a cam follower, etc. (not shown), so that the upward and downward movements of the movable member cause a drive bar 72 attached to the bracket 68, to move upward and downward. Consequently the tape feeder 62 and the take-up device 66 are operated.

When the drive bar 72 is moved downward by the above-described movable member, the cover member 60 is moved backward and the tape feeding device 62 prepares for each intermittent tape feeding. In the cover-film take-up device 66, the take-up reel 70 is rotated to take up the cover film 40 from the carrier tape 36, and a movable guide roller 74 is pivoted downward, so that a distance between the guide roller 74 and the take-up reel 70 increases and a certain length of the cover film 40 is removed from the carrier tape 36. On the other hand, when the movable member is moved upward, the drive bar 72 is also moved upward because of a biasing force applied thereto by a spring (not shown), so that the drive bar 72 follows the upward movement of the movable member. Consequently the carrier tape 36 is fed forward by one pitch by the tape feeding device 62, and the leading one of the electronic components from which the cover film 40 has been removed is fed to an electronic-component supplying position located in an electronic-component supplying section of each supplying cartridge 26. In this state, the take-up reel 70 of the take-up device 66 is stopped and the guide roller 74 is pivoted upward, so that the distance between the first guide roller 74 and the reel 70 decreases and the take-up device 66 feeds out the removed film 40, thereby permitting the carrier tape 36 to be fed forward by one pitch together with the cover member 60. Thus, when the carrier tape 36 is fed forward, no cover film 40 is removed or taken up. Therefore, the vibration input to the carrier tape 36 is reduced, and the electronic components accommodated in the pockets of the tape 36 are effectively prevented from changing their postures (e.g., being laid on their sides) or jumping out of the pockets.

The feeding of the carrier tape 36 and the taking-up of the cover film 40 are not not so important to the present invention and accordingly further description thereof is omitted.

Each electronic-component supplying cartridge 26 is attached to the support table 24 as described below.

Figure 3:
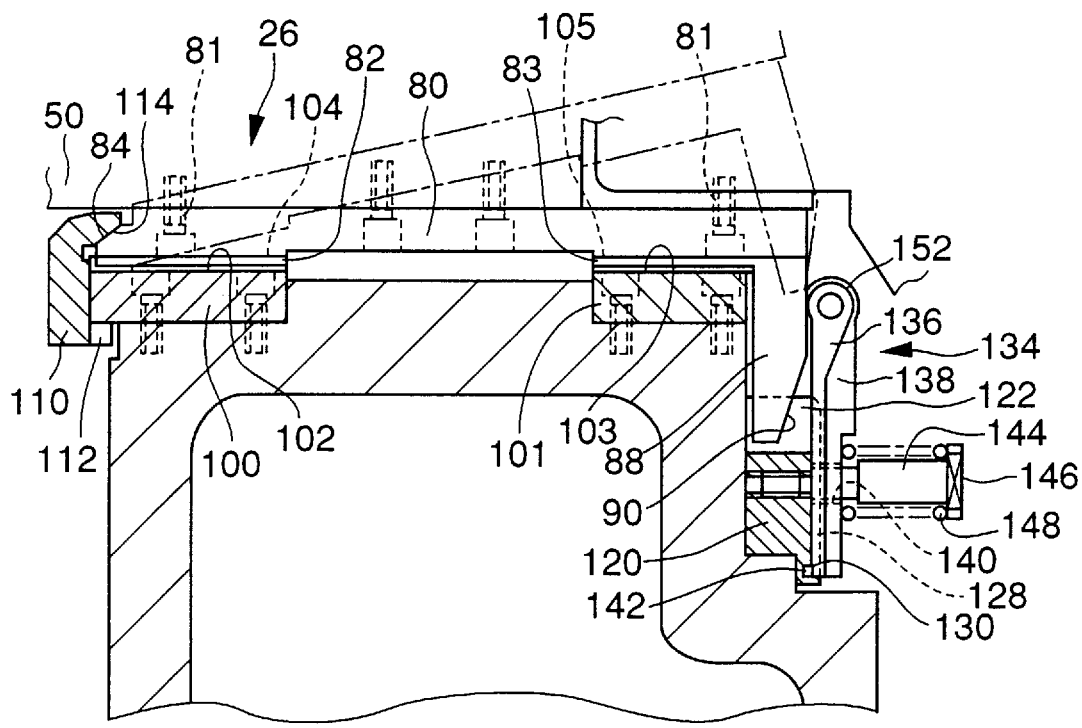
FIG. 3 is a side cross-section view of an electronic-component supplying cartridge of the supplying system of FIG. 1 which is attached to a support table of the supplying system.
Figure 4:
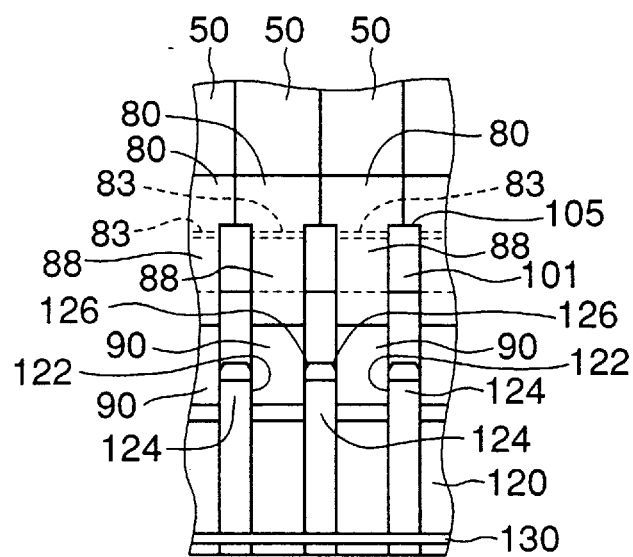
FIG. 4 is a side view of the supplying cartridge of FIG. 3 attached to the support table, in which an engaging lever provided on the support table is not shown.
Figure 5:
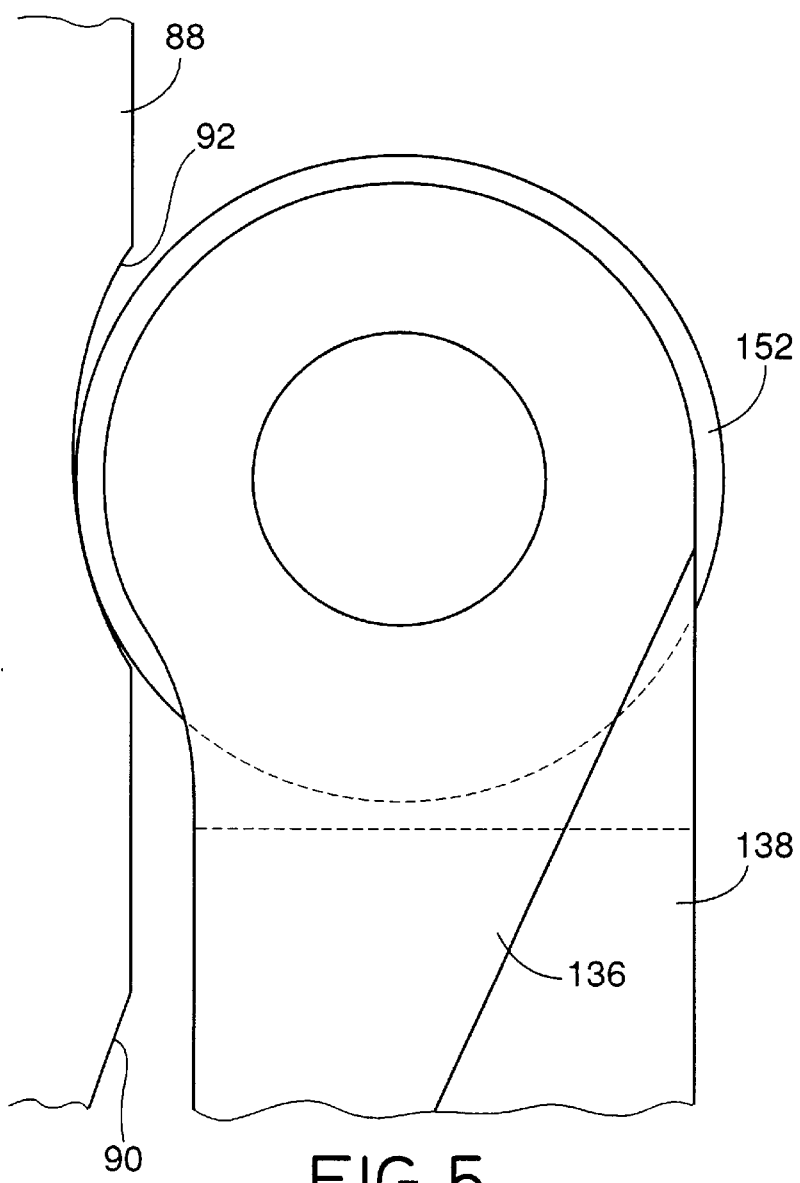
FIG. 5 is a side view of the engaging lever engaged with a second positioning projection of the supplying cartridge of FIG. 3.

As shown in FIGS. 3 to 5, the cartridge frame 50 has a bottom surface provided by a plate-like base member 80 which has a width equal to the width of the frame 50 and is fixed to the frame 50 with bolts 81. The base member 80 is formed as a part of the cartridge frame 50. The cartridge frame 50 is light because of being formed of an aluminum alloy. The base member 80 is formed of, e.g., a carbon steel for machine structural use, S50C, and is hardened. Two first positioning projections 82, 83 project from two locations of the base member 80 which are spaced apart from each other in the longitudinal direction of the cartridge 26. Each projection 82, 83 is provided in the form of a rail having a rectangular cross section. As shown in FIG. 4, each projection 82, 83 has a width smaller than the width of the base member 80, and projects from a width-wise central portion of the same 80.

A cartridge-side inclined surface 84 is formed in an upper surface of a front end portion of the base member 80. The inclined surface 84 is inclined obliquely upward and rearward relative to the bottom surface of the base member 80 or cartridge frame 50. A second positioning projection 88 projects downward from a rear end portion of the base member 80, such that the second projection 88 extends in a direction opposite to the direction of extension of the remaining portion of the cartridge frame 50 and makes a rectangle with respect to the base member 80. As shown in FIG. 3, the second projection 88 has a plate-like configuration having a width equal to the width of the first projections 82, 83. The second projection 88 includes a lower-end portion whose rear surface provides a guide surface 90. The guide surface 90 is inclined obliquely downward and frontward relative to the bottom surface of the cartridge frame 50. As shown in FIG. 5, an intermediate portion of the second projection 88 has a part-cylindrical engagement surface 92 which opens in a rear surface of the projection 88 and whose center line extends in the X direction.

The support table 24 is formed of an aluminum alloy. A first and a second cartridge positioning plate 100, 101 are fixed to a front and a rear portion of a top face of the support table 24, respectively, such that each positioning plate 100, 101 extends in the X direction. The two positioning plates 100, 101 are provided as parts of the support table 24. Each positioning plate 100, 101 is formed of the S50C carbon steel and is hardened. The first positioning plate 100 has a number of front first positioning grooves 102, and the second positioning plate 101 has a number of rear first positioning grooves 103. The front or rear first positioning grooves 102, 103 are formed at a pitch equal to the pitch of attachment of the cartridges 26 to the support table 24. The first grooves 102, 103 extend in the Y direction. The first grooves 102, 103 have a width slightly greater than the width of the first projections 82, 83, and has a depth greater than a length of projection of the same 82, 83. Top surfaces of the two positioning plates 100, 101 provide support surfaces 104, 105 of the support table 24, respectively, which support the bottom surface of the frame 50 or cartridge 26 attached to the support table 24.

Figure 6:
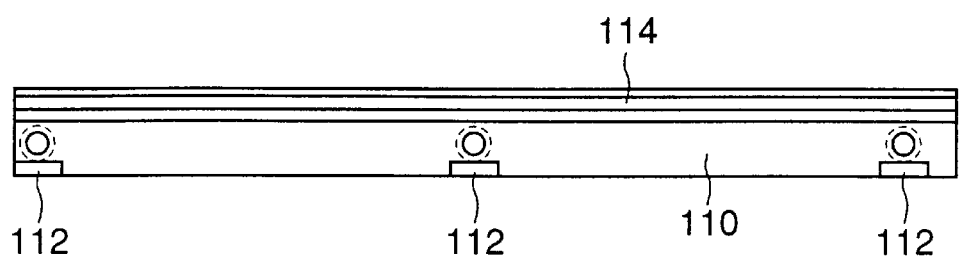
FIG. 6 is a side view of a stopper plate which is fixed to the support table of FIG. 3.

A stopper plate 110 which is formed of the S50C carbon steel and is hardened, is fixed to a top end of a front face of the support table 24 which face is near to the mounting device 12. The stopper plate 110 is provided as a part of the support table 24. As shown in FIGS. 6 and 7, the stopper plate 110 has a plate-like configuration having a length substantially equal to the length of the X-direction length of the support table 24. The stopper plate 110 has three engagement projections 112 provided at a bottom end of one side surface thereof parallel to a longitudinal direction thereof. The three engagement projections 112 are spaced apart from one another in the longitudinal direction of the stopper plate 110. The stopper plate 110 is fixed to the first or front positioning plate 100 with bolts (not shown), with the engagement projections 112 being engaged with a bottom surface of the positioning plate 100.

A top portion of the stopper plate 110 projects upward from a level of the first positioning plate 100, and the top portion includes a projection extending over the positioning plate 100. The projection has a bottom surface 114 which is inclined obliquely upward and rearward relative to the front support surface 104 of the support table 24. The bottom surface or table-side inclined surface 114 is engaged with the cartridge-side inclined surface 84 when the cartridge 26 is attached to the support table 24. The table-side inclined surface 114 and the front support surface 104 define or contain an acute angle therebetween, and the cartridge-side inclined surface 84 and the bottom surface of the cartridge frame 50 contain an acute angle therebetween that is substantially equal to that contained by the surfaces 114, 104.

A third cartridge positioning plate 120 which is formed of the S50C carbon steel and is hardened, is fixed to an intermediate portion of a rear face of the support table 24 which portion is apart downward from the rear support surface 105. As shown in FIGS. 8 and 9, the third positioning plate 120 has, in a top surface thereof, a number of second positioning grooves 122 formed at a pitch equal to the pitch of attachment of the cartridges 26 to the support table 26. The second grooves 122 extend in a direction of thickness of the third positioning plate 120, i.e, in the Y direction. Each second groove 122 has a width slightly greater than the width of the second projection 88. The third positioning plate 120 has a number of partition walls 124 defining the second positioning grooves 122. Each partition wall 124 has a tapered top portion which provides a pair of guide surfaces 126, 126.

As shown in FIG. 3, the third positioning plate 120 has, in a rear surface thereof, a number of vertical grooves 128 each having a width equal to the width of the second positioning grooves 122. In addition, the third positioning plate 120 has, in a bottom portion thereof, an engagement groove 130 extending in a longitudinal direction thereof, i.e., in the X direction.

An engaging lever 134 is engaged with each vertical groove 128 such that the lever 134 is movable relative to the groove 128 in the Y direction. The lever 134 includes an engagement portion 136 having a width slightly smaller than that of the groove 128, and a great-width portion 138 having a width greater than that of the engagement portion 136 and smaller than the pitch of attachment of the supplying cartridges 26 to the support table 24. As shown in FIGS. 10 and 11, the lever 134 has an elongate hole 140 which is formed in a lower portion thereof and extends in a longitudinal direction thereof, and an engagement projection 142 provided at a lower end thereof.

As shown in FIG. 3, a screw member 144 is threadedly engaged with a bottom wall of each vertical groove 128, such that the screw member 144 extends through the elongate hole 140 of the engaging lever 134. An elastic member (e.g., a coil spring 148) as a biasing device is provided between the lever 134 and a large-diameter head portion 146 of the screw member 144, so as to bias the lever 134 in a direction in which the engagement portion 136 of the lever 134 is engaged with the vertical groove 128 and the engagement projection 142 is engaged with the engagement groove 130. Thus, the engaging lever 134 is prevented from being moved out of position in the X direction and the vertical direction.

As shown in FIG. 3, a roller 152 is attached to a top end of the engaging lever 134 such that the roller 152 is rotatable about an axis line parallel to the X direction. As shown in FIG. 5, the roller 152 has a radius smaller than a radius of curvature of the engagement surface 92 formed in the rear surface of the second positioning projection 88.

Next, the electronic-component ("EC") holder 54 will be described.

Figure 12:
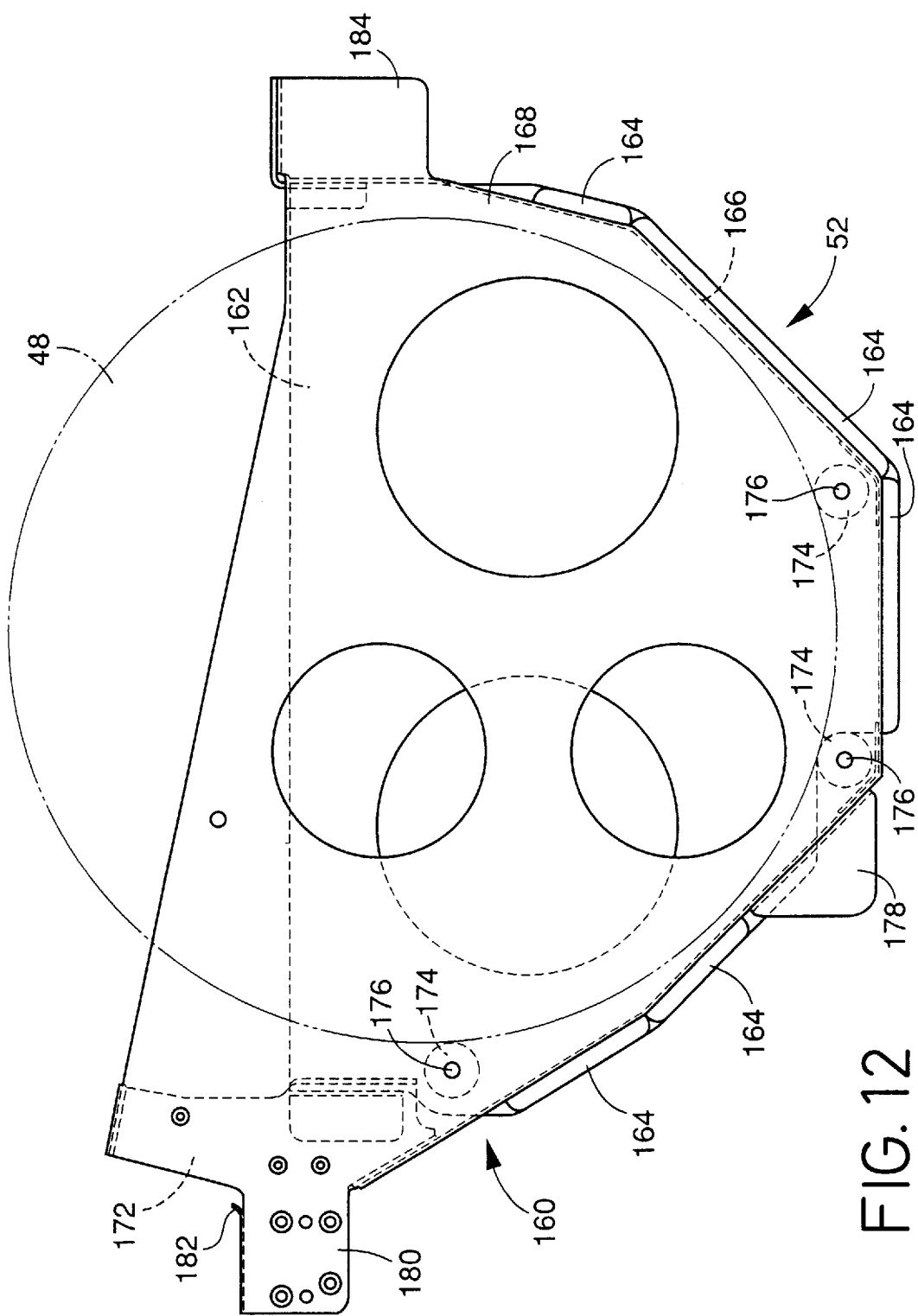
FIG. 12 is a side view of a reel holder as an electronic-component holder of the supplying cartridge of FIG. 3.
Figure 13:
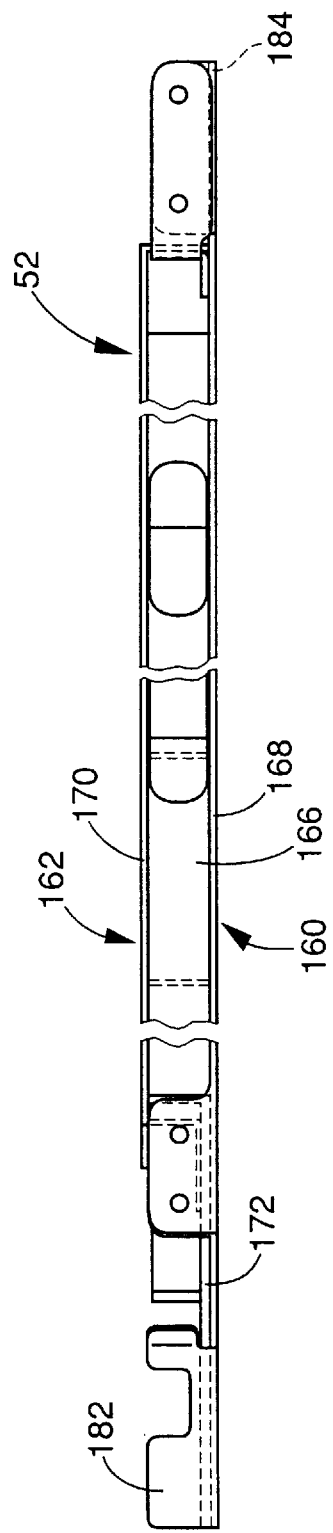
FIG. 13 is a plan view of the reel holder of FIG. 12.
Figure 14:
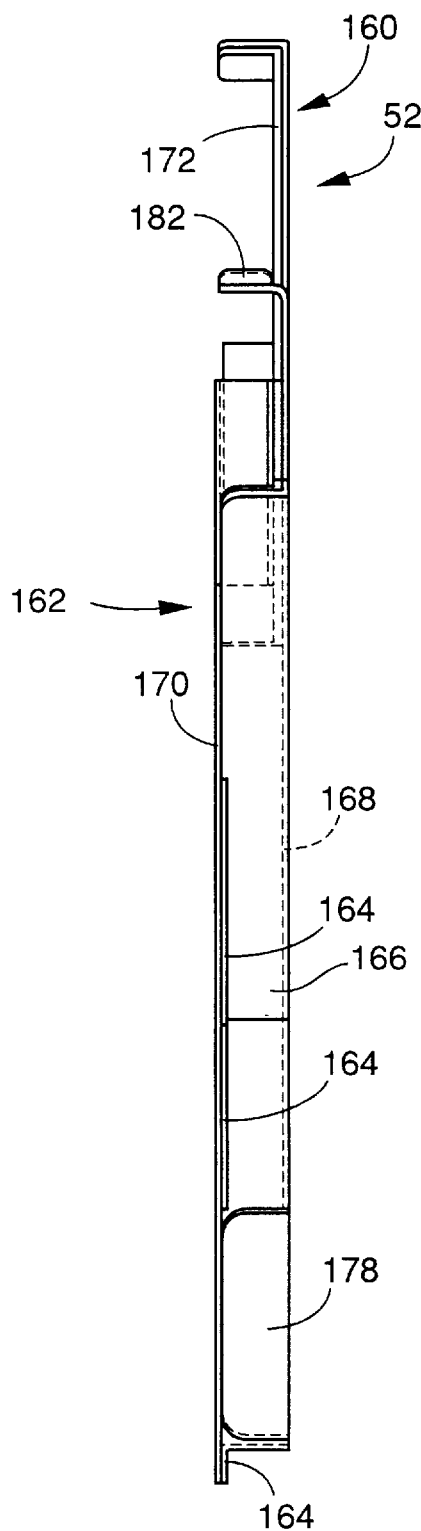
FIG. 14 is a side view of the reel holder of FIG. 12.

As shown in FIGS. 12, 13, and 14, the reel holder 52 as the EC holder 54 is provided by a container-like member which has a small width and has a generally semi-circular configuration corresponding to more than a half of a polygon circumscribing the circumferential circle of the tape reel 48. The reel holder 52 includes a first wall member 160 and a second wall member 162 each of which is provided by a thin plate having a constant thickness. Peripheral portions of the first wall member 160 are bent at right angles toward the second wall member 162 so as to provide bottom walls 166 of the container-like reel holder 52. Free end portions of the bent peripheral portions of the first wall member 160 are once more bent outward at right angles with respect to the bottom walls 166, so as to provide welding portions 164 which are welded to the second wall member 162. Thus, the reel holder 52 is provided in the form of an integral container-like member. The two wall members 160, 162 have two side walls 168, 170, respectively, which are parallel to each other and are distant from each other by slightly more than the width of the tape reel 48. Reference numeral 172 designates a reinforcement plate which is fixed to an inner surface of a front portion of the side wall 168 provided by the first wall member 160.

Between the two side walls 168, 170, there are provided three support rollers 174 each of which is rotatable about an axis member 176 extending parallel to the X direction. The tape reel 48 is held in the reel holder 52 and is rotatably supported by the three rollers 174.

Figure 15:
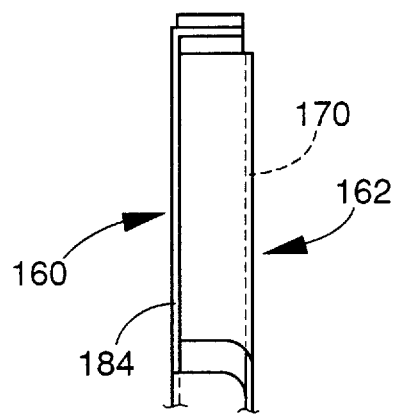
FIG. 15 is another side view of a portion of the reel holder of FIG. 13.

A first engagement member 178 is fixed to a front surface of a lower one of the bottom walls 166 of the reel holder 52. An attachment member 180 projects from a front end of the side wall 168 provided by the first wall member 160, such that the attachment member 180 extends parallel to the side wall 168. A top portion of the attachment member 180 is bent at a right angle toward the side wall 170 provided by the second wall member 162, so as to provide a tape guide 182. As shown in FIG. 2, the reel holder 52 is fixed to the cartridge frame 50 via the attachment member 180, so that the tape guide 182 covers a rear portion of the cartridge frame 50 and the carrier tape 36 is fed through a passage provided between the cartridge frame 50 and the tape guide 182. As shown in FIGS. 12, 13, and 15, a second engagement member 184 projects from a rear surface of the side wall 168 such that the second engagement member 184 extends parallel to the side wall 168.

Figure 16:
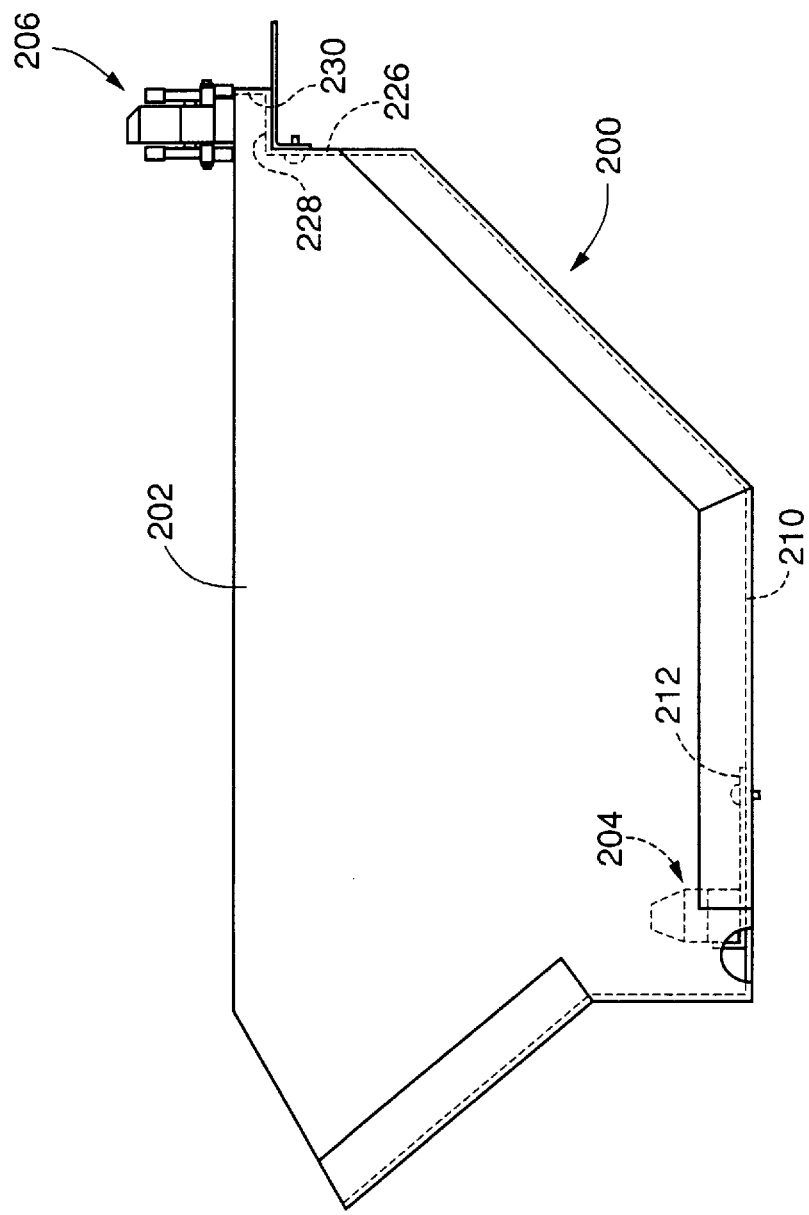
FIG. 16 is a side view of a bucket of an electronic-component-holder supporting device which supports the electronic-component holder.
Figure 17:
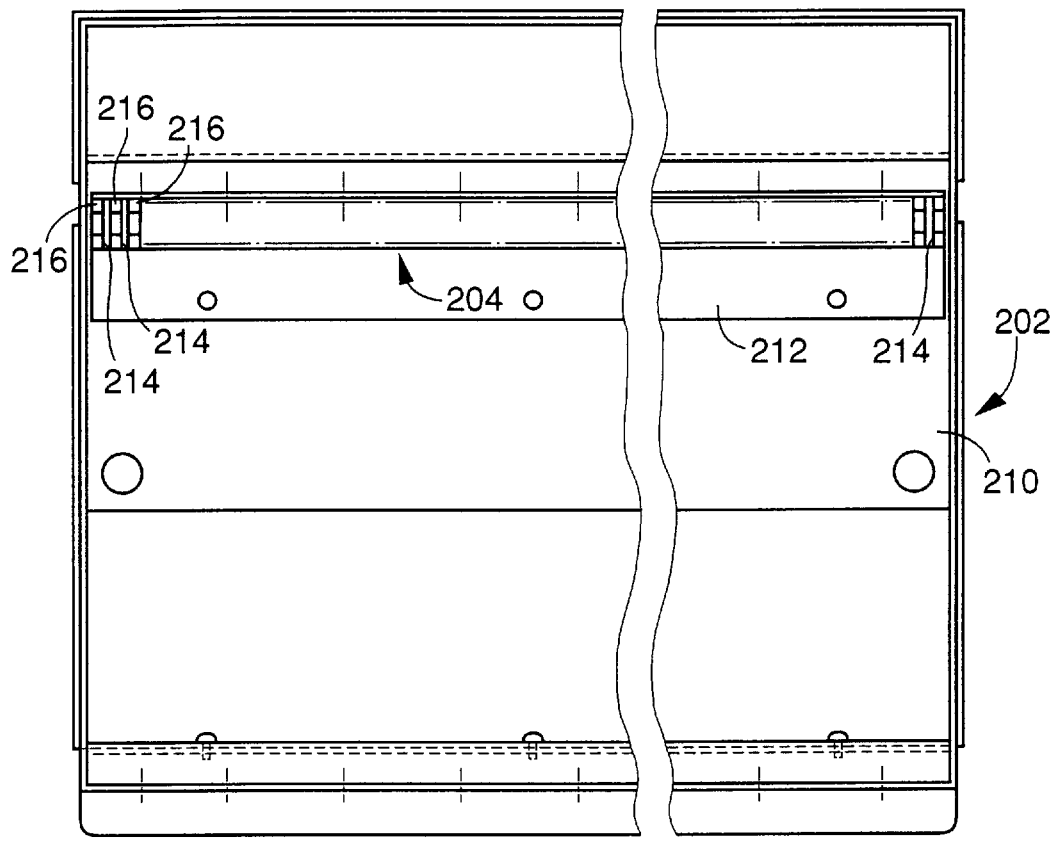
FIG. 17 is a plan view of the bucket of FIG. 16.
Figure 18:
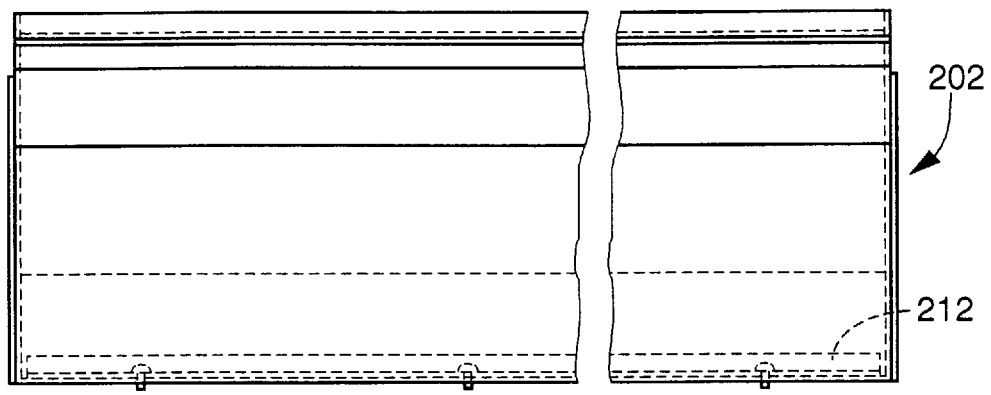
FIG. 18 is a side view of the bucket of FIG. 16.

As shown in FIG. 2, the EC holder 54 constructed as described above, is supported by an electronic-component-holder supporting device 200 which is provided in a rear portion of the support table 24. As shown in FIGS. 16, 17, and 18, the supporting device 200 includes a bucket 202 fixed to the support table 24, an electronic-component-holder support member 204 provided in a front portion of the bucket 202, and an engaging device 206 provided in a rear portion of the bucket 202. The bucket 202 is provided by a container-like member which opens upward and has a length enough to receive respective holders 54 of a number of cartridges 26. The bucket 202 is fixed to the support table 24 such that the support member 204 extends in the X direction.

A bracket 212 having an L-shaped cross section is fixed to a front portion of an inner surface of a bottom wall 210 of the bucket 202. As shown in FIG. 17, the bracket 212 has an elongate shape, and the support member 204 is fixed to the bracket 212. The support member 204 is provided by an elongate thick plate which has a number of first engagement grooves 214 which are formed equidistantly from one another in a top portion thereof and each of which extends through the thick plate in the Y direction. Each first engagement groove 214 has a width which permits the first engagement member 178 fixed to the reel holder 52 to fit therein with a small clearance being left in a width direction thereof. The first engagement grooves 214 are defined by a number of wall members 216. Although not shown in the drawings, each of the wall members 216 has opposite side surfaces which extend in the Y direction and whose top portions are inclined like inclined surfaces 252 shown in FIG. 19.

Figure 19:
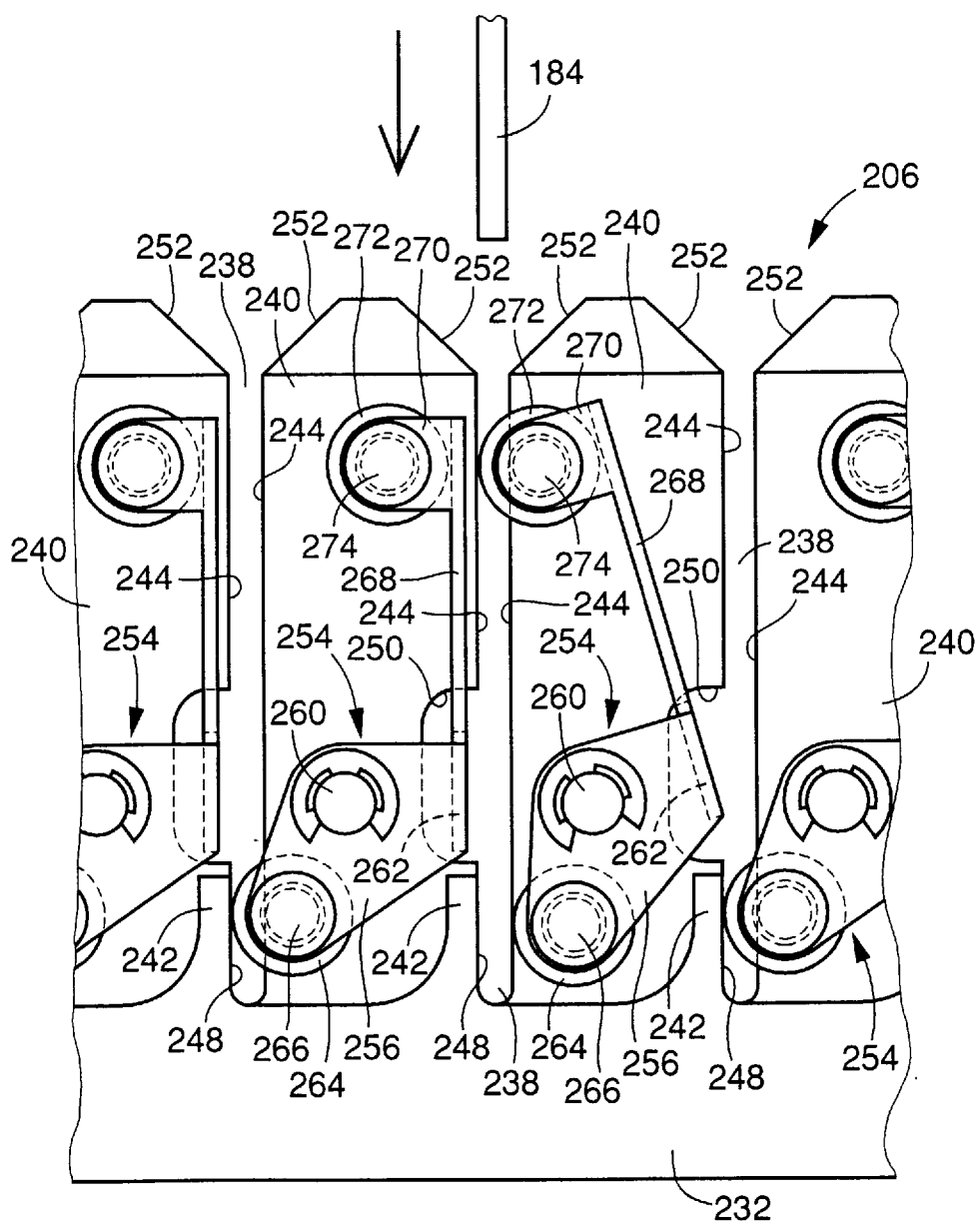
FIG. 19 is a side view of a portion of an engaging device of the electronic-component-holder supporting device.
Figure 20:
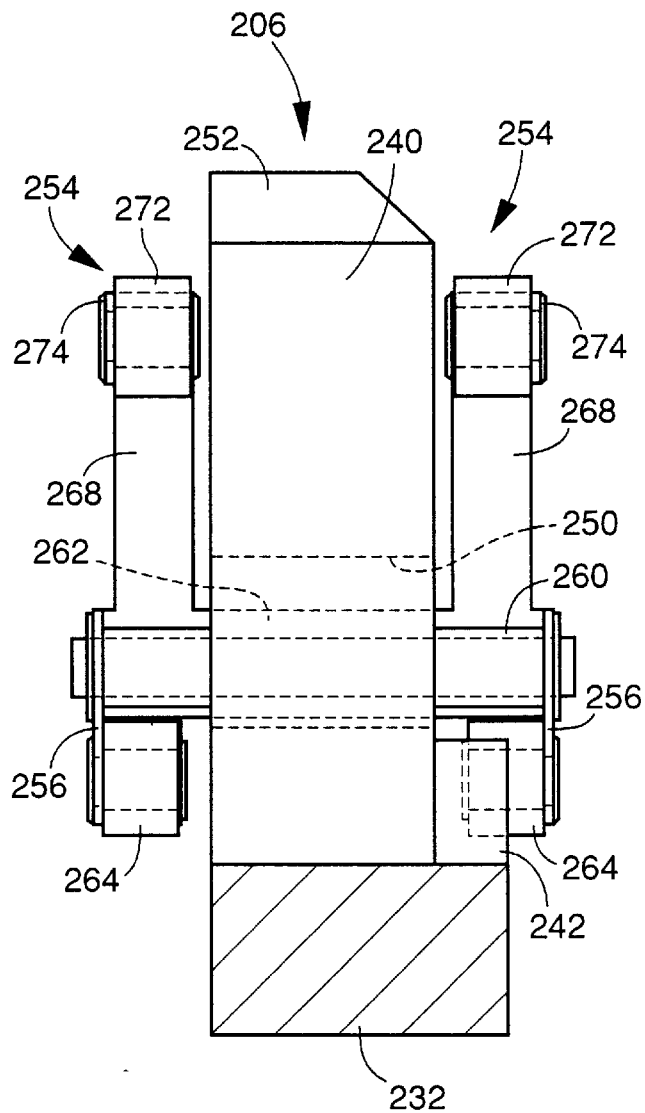
FIG. 20 is a side cross-section view of the engaging device of FIG. 19.

As shown in FIG. 16, a top portion of a rear wall 226 of the bucket 202 includes a horizontal support surface 228 and a vertical attachment surface 230 which projects upward from the support face 228 and extends in the X direction. The engaging device 206 is attached to the attachment surface 230. As shown in FIGS. 19 and 20, the engaging device 206 includes an elongate stop member 232 which is fixed to the attachment surface 230 with screws.

The stop member 232 has a number of second engagement grooves 238 which are formed equidistantly from one another in a top portion thereof and each of which extends in the Y direction. Each second engagement groove 238 has a width which permits the second engagement member 184 fixed to the reel holder 52 to fit therein. Although different cartridges 26 may have second engagement members 184 with different thickness values, the width of each second engagement groove 238 is selected at a value great enough to permit various second engagement members 184 with different thickness values to fit therein.

Each second engagement groove 238 is defined by a pair of wall members 240 on both sides of each groove 238. Each wall member 240 includes a stop projection 242 projecting from a lower portion of a rear surface thereof. The stop projection 242 has a stop surface 248 which is flush with one of a pair of side surfaces 244 which cooperate with each other to define a second engagement groove 238. A recess 250 is formed in an intermediate portion of each wall member 240 above the stop projection 242, such that the recess 250 opens in the side surface 244 flush with the stop surface 248. A top portion of each wall member 240 has two inclined surfaces 252 shown in FIG. 19. Thus, each groove 238 opens upward. A pair of rotatable engagement members 254 are provided in front and rear of each wall member 240, respectively. That is, the two engagement members 254 are provided outside each engagement groove 238 and adjacent to the front and rear ends of each groove 238. Each rotatable member 254 includes a lever 256 formed of an elastic or spring sheet. The two levers 256 are attached to opposite end portions of an axis member 260 fixed to each wall member 240, such that the levers 256 are rotatable about the axis member 260 extending in the Y direction. The two levers 256 are connected to each other via a connection portion 262 and are rotatable as a unit. The connection portion 262 extends through the recess 250 formed through each, wall member 240, and does not project into the engagement groove 238.

A first engagement roller 264 is attached to a lower portion of each lever 256 below the axis member 260, such that the roller 264 is rotatable about an axis member 266 extending in the Y direction. Each lever 256 includes a plate-like arm portion 268 positioned above the axis member 260. A second engagement roller 272 is attached to a free end portion 270 of the arm portion 268, such that the roller 272 is rotatable about an axis member 274 extending in the Y direction. As shown in FIG. 19, the first roller 264 is opposed to the stop surface 248 of the stop projection 242. In the state in which the first roller 264 is held in contact with the stop surface 248, the arm portion 268 extends vertically upward without projecting into the next second engagement groove 238, thereby permitting another second engagement member 184 to fit in the next groove 238. A limit of rotation of the arm portion 268, i.e., rotatable engagement member 254 in a direction in which the first roller 264 is moved away from the stop surface 248, is defined by abutment of the connection portion 262 on an inner surface of the recess 250.

Figure 21:
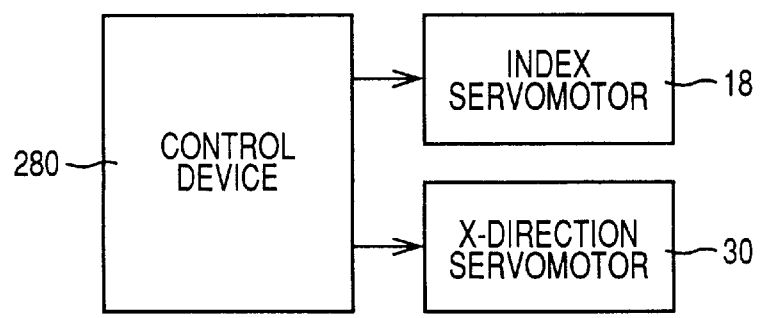
FIG. 21 is a diagrammatic view of a pertinent portion of a control device which controls the supplying system and the mounting device of FIG. 1.

In the present embodiment, the electronic-component supplying system 10 and the electronic-component mounting device 12 are controlled by a control device 280 shown in FIG. 21. The control device 280 is essentially provided by a computer which controls the index servomotor 18, the X-direction servomotor 30, etc.

When each supplying cartridge 26 is attached to the support table 24, a front portion of the cartridge 26 is tilted down and a rear portion of the same 26 is tilted up, subsequently a front portion of the front first positioning projection 82 of the base member 80 is fit in the front first positioning groove 102, and then the cartridge 26 is moved frontward until the cartridge-side inclined surface 84 engages the table-side inclined surface 114 of the support table 24, as shown in FIG. 3.

As indicated at two-dot chain line in FIG. 3, with the two inclined surfaces 84, 114 being engaged with each other, the supplying cartridge 26 is placed on the rear support surface 105. Since the front first positioning projection 82 with a rectangular cross section is fit at a front end portion thereof in the front first positioning groove 102, the cartridge 26 is positioned in the width-wise direction thereof. Therefore, when the cartridge 26 is placed on the rear support surface 105, the rear first positioning projection 83 is easily fit in the rear first positioning groove 103.

In the above step, the inclined guide surface 90 of the second positioning projection 88 is engaged with the roller 152 of the engaging lever 134, so that the inclination of the guide surface 90 results in rotating, against the biasing force of the coil spring 148, the roller 152 of the engaging lever 134 in a direction in which the lever 134 is moved away from the second positioning projection 88. Thus, the second positioning projection 88 enters a space between the engaging lever 134 and the support table 24.

In the state in which the cartridge-side inclined surface 84 is engaged with the table-side inclined surface 114, the pair of first positioning projections 82, 83 are fit in the pair of first positioning grooves 102, 103, respectively, and the supplying cartridge 26 is placed on the support surfaces 104, 105. Simultaneously, the lower end portion of the second positioning projection 88 is fit in the second positioning groove 122 and the roller 152 of the engagement lever 134 is engaged with the engagement surface 92 of the second positioning projection 88, so that the biasing force of the coil spring 148 is applied to the second positioning projection 88 via the engaging lever 134.

The engagement surface 92 is provided in the form of a part-cylindrical curved surface as shown in FIG. 5. Accordingly, when the second positioning projection 88 is moved downward, the engaging lever 134 is moved in a rearward direction away from the support table 24, for a while, and subsequently the lever 134 is moved back toward the second projection 88 upon engagement of the curved surface 92 with the roller 152. The operator can feel this engagement that indicates that the cartridge 26 has just been attached to the support table 24.

Because of the biasing action of the coil spring 148, the cartridge-side inclined surface 84 is pressed against the table-side inclined surface 114, so that the engagement of the two surfaces 84, 114 results in pressing the front half of the cartridge 26 against the front support surface 104. Simultaneously, an angular momentum is produced which has a center at the position where the two inclined surfaces 84, 114 are engaged with each other and has a radius equal to the distance between the center and the position where the roller 152 is engaged with the engagement surface 92 as seen in the vertical direction, i.e., in a direction perpendicular to the support surfaces 104, 105. Because of this angular momentum, the rear half of the cartridge 26 opposite to the front half thereof including the cartridge-side inclined surface 84 is pressed on the rear support surface 105 of the support table 24.

In addition, the engagement surface 92 is provided by a part-cylindrical curved surface and has a radius of curvature larger than the radius of the roller 152, and the roller 152 is designed to engage a lower portion of the engagement surface 92 which is inclined obliquely downward and rearward. Consequently the cartridge 26 receives a downward force applied by the coil spring 148 via the engaging lever 134 or the roller 152. Thus, the rear half of the base member 80 is pressed down on the rear support surface 105. After all, both the front and rear halves of the cartridge 26 are positively pressed against the support table 24 in such a manner that the cartridge 26 is effectively prevented from moving up from the top surfaces 104, 105 of the support table 24.

The engaging lever 134, coil spring 148, and second positioning projection 88 cooperate with one another to provide a cartridge pressing device for pressing the cartridge 26 on the support table 24; and the cartridge pressing device cooperates with the cartridge-side and table-side inclined surfaces 84, 114 to provide a cartridge clamping device for clamping the cartridge 26 on the support table 24.

In addition, the supplying cartridge 26 is inhibited from being moved in the width-wise direction thereof, at two positions apart from each other in the vertical direction, i.e., one position where the first positioning projections 82, 83 are fit in the first positioning grooves 102, 103 and the other position where the second positioning projection 88 is fit in the second positioning groove 122. Therefore, although the width of the cartridge frame 50 is considerably small, the cartridge 26 can maintain an upright posture on the support table 24. When the support table 24 is moved in the X direction for aligning a selected one of the supplying cartridges 26 with the EC supplying position of the supplying system 10, an angular momentum due to inertia may be exerted to each cartridge 26 in a direction in which to lay down the cartridge 26. However, the cartridge 26 is effectively prevented from being laid down because of the angular moment. Therefore, the top portion of the cartridge 26 where each electronic component is picked up by the mounting device 12 can be moved to the EC supplying position with substantially no positioning error with respect to the X direction. Thus, the electronic components are supplied to the mounting device 12 with high accuracy.

When the cartridge 26 is attached to the support table 24, the first engagement member 178 fixed to the reel holder 52 of the cartridge 26 is fit in, or engaged with, one of the first engagement grooves 214 of the EC-holder support member 204 of the bucket 202 fixed to the support table 24. Simultaneously, the second engagement member 184 is fit in, or engaged with, one of the second engagement grooves 238 of the engaging device 206. Even if there may be some misalignment in the X direction between the engagement member 178 or 184 and the engagement groove 214 or 238, respectively, the engagement member 178 or 184 is guided by the inclined surfaces 252 formed with each wall member 216 or 240, so as to be engaged with the engagement groove 214 or 238.

As shown in FIG. 19, when the cartridge 26 is attached to the support table 24, each rotatable engagement member 254 may take a position between two extreme positions in one of which the first engagement roller 264 is in contact with the stop surface 248 and the second roller 272 is away from the second engagement groove 238 and in the other of which the first engagement roller 264 is away from the stop surface 248 and the second roller 272 projects into the second engagement groove 238. The second extreme position is defined by the abutment of the arm portion 268 on the inner surface of the recess 250, as described above.

Figure 22:
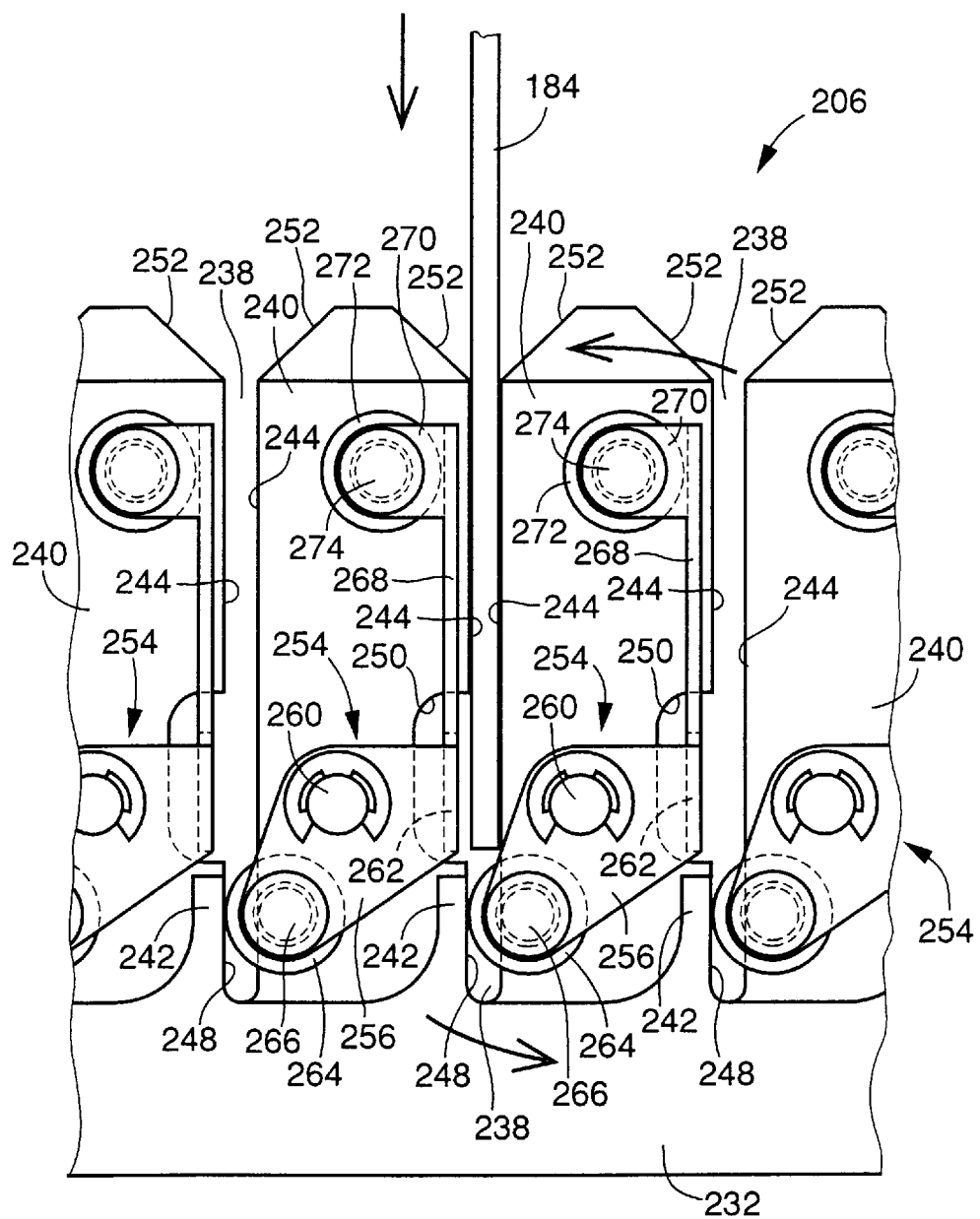
FIG. 22 is a view for illustrating the manner in which the electronic-component holder is engaged with the engaging device of FIG. 19.
Figure 23:
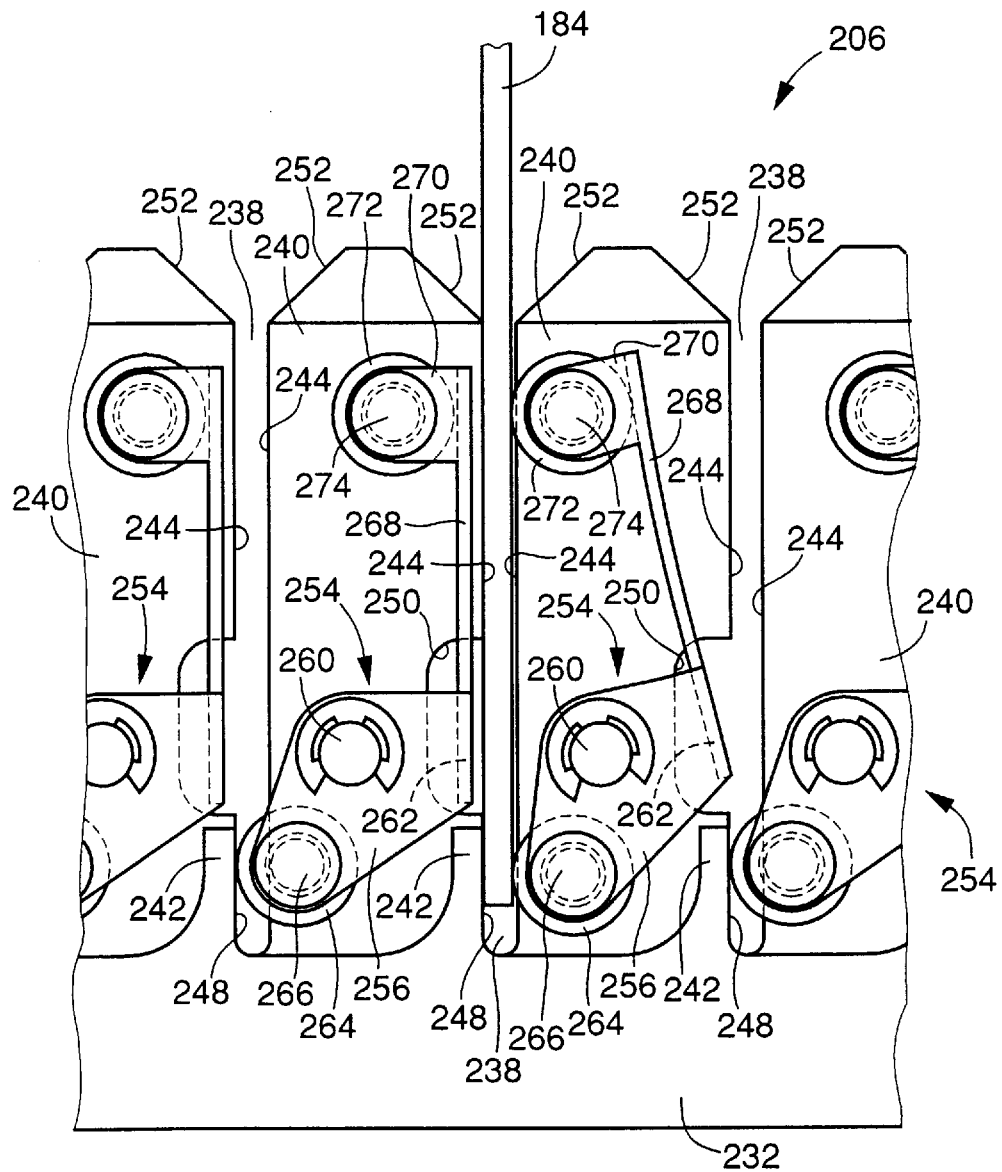
FIG. 23 is a view for illustrating the state in which an engagement member of the electronic-component holder is engaged with the engaging device of FIG. 19.

In the case where each rotatable engagement member 254 initially takes the above-described first extreme position, as the second engagement member 184 enters the second engagement groove 238, the second member 184 engages the lever 256, thereby rotating the lever 256 in a direction in which the first roller 264 is moved away from the stop surface 248 and the second roller 272 engages the second member 184, as shown in FIG. 22. The second roller 272 engages the second member 184, before the first roller 264 engages one of opposite major side surfaces of the second member 184, and then the arm portion 268 is elastically deformed and permits the first roller 264 to be moved away from the stop surface 248, until the first roller 264 engages the second member 184. As shown in FIG. 23, in the state in which the first roller 264 is engaged with the side surface of the second member 184, the two rollers 264, 272 produces an elastic force because of the elastic deformation of the arm portion 268, and the second member 184 is fixedly pressed against the side surface 244 and the stop surface 248 of the next wall member 240. Accordingly, the EC holder 54 is effectively prevented from being moved in the X direction. When a second engagement member 184 having a greater constant thickness is fit in the second groove 238, the arm portion 268 of the rotatable engagement member 254 is elastically deformed by a greater amount, thereby permitting the second member 184 to be engaged with the rotatable member 254. Irrespective of the thickness of the second engagement member 184, the second member 184 is pressed against the side surface 244 and stop surface 248 of the wall member 240, because of the engagement thereof with the first and second rollers 264, 272, when the second member 18 is fit in the second groove 238. Thus, the EC holder 54 is prevented from being moved in the widthwise direction thereof. In the present embodiment, one of a pair of opposed side surfaces 244 defining each second groove 238 therebetween, provides a stop surface defining a limit of movement of the EC holder 54 pressed by the rotatable engagement member 254.

On the other hand, in the case where each rotatable engagement member 254 initially takes the above-described second extreme position, as the second engagement member 184 enters the second engagement groove 238, the second member 184 engages the second roller 272, thereby rotating the lever 256 in a direction in which the second roller 272 is moved away from the second groove 238. Consequently the rotatable engagement member 254 is rotated to the first extreme position in which the first roller 264 contacts the stop surface 248. Then, like in the first case where the rotatable engagement member 254 initially takes the first extreme position, the first and second rollers 264, 272 engage the second member 184, thereby pressing the second member 184 against the side surface 244 and stop surface 248 of the next wall member 240.

When the EC holder 54 is attached to the EC-holder supporting device 200, the reel holder 52 as the EC holder 54 may elastically be deformed if the engagement members 178, 184 of the reel holder 52 are engaged with the engagement grooves 214, 238 of the supporting device 200, respectively, in spite of some possible misalignment between the reel holder 52 and the supporting device 200 in the X direction. However, the cartridge frame 50 is effectively prevented from being elastically deformed, and the EC supplying position of each cartridge 26 is effectively prevented from being moved out of position, because the cartridge frame 50 is rigidly attached to the support table 24. As described previously, this rigid attachment is achieved by the positioning of the cartridge frame 50 relative to the support table 24 owing to the engagements of the two first positioning projections 82, 83 and the two first positioning grooves 102, 103 at the two locations spaced away from each other in the Y direction and to the engagement of the second positioning projection and groove 88, 122 at the position spaced away downward from the above-mentioned two positions, as well as by the pressing of the front portion of the cartridge frame 50 against the support surface 104 owing to the engagement of the cartridge-side and table-side inclined surfaces 84, 114 and the pressing of the rear portion of the cartridge frame 50 against the support surface 105 owing to the engagement of the engaging lever and surface 134, 92.

In addition, the fixing device 206 effectively prevents the second engagement member 184 from being moved in the X direction, and the EC-holder support member 204 effectively prevents the first engagement member 178 from being moved more than a certain amount in the X direction. Therefore, when the support table 24 is moved in the X direction, the EC holder 54 is effectively prevented from being vibrated because of the inertia force of the EC holder 54 itself and the inertia force of the carrier tape 36 accommodated therein. Accordingly, the EC supplying position of each cartridge 26 is effectively prevented from being moved out of position because of the vibration of the cartridge frame 50. The amount of vibration of the EC holder 54 is much lower than that of the EC holder 54 produced in a comparative case where the engaging device 206 is not provided to prevent the movement of the second member 184 in the X direction. Such a low amount of vibration cannot cause any substantial movement of the EC supplying position of each cartridge 26 rigidly attached to the support table 24.

When each supplying cartridge 26 is detached from the support table 24, the cartridge 26 is slightly pulled rearward, against the biasing force of the coil spring 148, so as to loosen the engagement of the cartridge-side and table-side inclined surfaces 84, 114. In this state, the rear half of the cartridge 26 is pulled up, so that the cartridge 26 is rotated about the position where the two inclined surfaces 84, 114 are engaged with each other. Consequently the rear half of the cartridge 26 is moved apart from the rear support surface 105 of the support table 24. Because of the provision of the inclined guide surface 90, a considerably small amount of rearward movement of the roller 152 results in permitting the second positioning projection 88 to be disengaged from the second positioning groove 122 and the engagement lever 134, thereby permitting the cartridge 26 to be detached from the support table 24. In addition, when the cartridge 26 is rotated about the two inclined surfaces 84, 114, the engagement portions 184, 178 of the reel holder 52 are disengaged from the engagement grooves 238, 214 of the support table 24, respectively. Thus, the EC holder 54 is released from the support of the EC-holder supporting device 200.

Thus, the supplying cartridge 26 can be attached to, and detached from, the support table 24, by rotating the cartridge 26 about the position of engagement of the cartridge-side and table-side inclined surfaces 84, 114. Stated differently, the attachment and detachment of the cartridge 26 to and from the table 24 only requires the support table 24 to have a space to permit the rotation of the cartridge 26 whose center coincides with the position of engagement of the cartridge-side and table-side inclined surfaces 84, 114 and whose radius is slightly greater than the distance between the center and the engaging lever 134.

The reason why the supplying cartridge 26 is slightly pulled rearward, first, for the detachment thereof from the support table 24 is that if the rear half of the cartridge 26 is pulled up vertically, the front half of the same 26 would function as a lever and the cartridge-side inclined surface 84 would forcibly push up the table-side inclined surface 114, thereby increasing the wearing of the two inclines surfaces 84, 114. For more positively avoiding this problem, it is possible to modify a front end portion of the base member 80 which is located in front of a vertical line passing through a top end of the table-side inclined surface 114, in such a manner that the modified front end portion is provided with a cylindrical surface so as to be able to contact the front support surface 104. The central axis line of this cylindrical surface may coincide with a horizontal line where the cartridge-side inclined surface 84 is engaged with a top end of the table-side inclined surface 114. This cylindrical surface may be replaced by an inclined surface which is positioned higher than the cylindrical surface. Alternatively, a front end portion of the front support surface 104 may be modified to have a surface which is curved or inclined obliquely upward and rearward.

Figure 24:
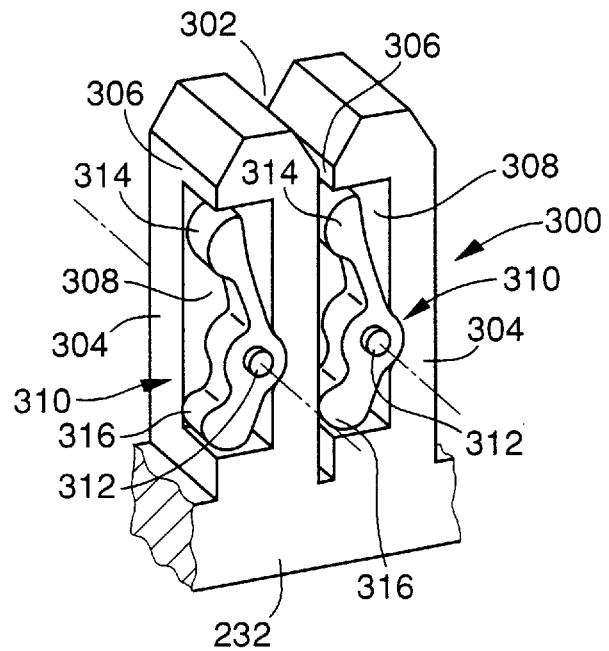
FIG. 24 is a perspective view of a portion of an engaging device of another electronic-component supplying system as a second embodiment of the present invention.

Referring next to FIG. 24, there is illustrated an engaging device 300 of another electronic-component supplying system as a second embodiment of the present invention. The supplying system in accordance with the second embodiment is different from the supplying system 10 shown in FIG. 1 only in that the former system employs the engaging device 300 in place of the engaging device 206 employed in the latter system 10.

The engaging device 300 has a number of wall members 304 (only two are shown) defining a number of engagement grooves 302 (only one is shown). Each wall member 304 has a receiving recess 308 which opens in a side surface 306 and which receives a rotatable engagement member 310. The engagement member 310 is formed of a synthetic resin, has an elongate configuration, and is elastically deformable. A lengthwise intermediate portion of the engagement member 310 is attached to the wall member 304 via an axis member 312 extending in the Y direction, such that the engagement member 310 is rotatable about the axis member 312. A first and a second engagement projection 314, 316 each of which has a semicircular cross section project toward the engagement groove 302 from lengthwise opposite two end portions of the engagement member 310, respectively. While an electronic-component holder 54 is not engaged with the engaging device 300, at least one of the two engagement projections 314, 316 projects into the engagement groove 302.

When an electronic-component supplying cartridge 26 is attached t-o a support table 24, a plate-like engagement member 184 of a reel holder 52 is engaged with the engagement groove 302, and the two engagement projections 314, 316 are engaged with the engagement member 184 because of the elastic deformation of the rotatable engagement member 310. Thus, the engagement member 184 is pressed against the side surface 306 of the wall member 304, and accordingly the EC holder 54 is effectively prevented from being moved in the X direction.

Figure 25:
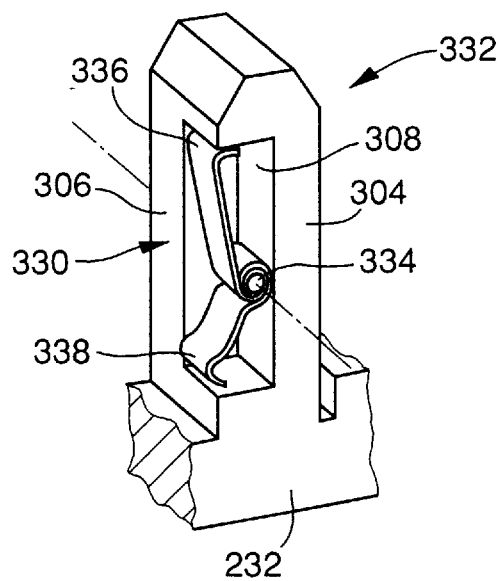
FIG. 25 is a perspective view of a portion of an engaging device of yet another electronic-component supplying system as a third embodiment of the present invention.

FIG. 25 shows an engaging device 332 of another electronic-component supplying system as a third embodiment of the present invention. The supplying system in accordance with the third embodiment is different from the supplying system shown in FIG. 24 only in that the former system employs the engaging device 332 in place of the engaging device 300 employed in the latter system.

The engaging device 332 has a rotatable engagement member 330 formed of a spring sheet, in place of the rotatable engagement member 310 used in the fixing device 300 shown in FIG. 24. A lengthwise intermediate portion of the engagement member 330 is attached to a wall member 304 via an axis member 334 extending in the Y direction, such that the engagement member 330 is rotatable about the axis member 334. A first and a second engagement projection 336, 338 each of which has a part-cylindrical outer surface are formed by bending lengthwise opposite two end portions of the engagement member 330, respectively, and project toward an engagement groove 302.

While an electronic-component supplying cartridge 26 is not attached to a support table 24, at least one of the two engagement projections 336, 338 projects into the engagement groove 302. On the other hand, when a plate-like engagement member 184 of an electronic-component holder 54 is engaged with the engagement groove 302, the two engagement projections 336, 338 are engaged with the engagement member 184 because of the elastic deformation of the rotatable engagement member 330. Thus, the engagement member 184 is pressed against a side surface 306 of the wall member 304 and accordingly the EC holder 54 is effectively prevented from being moved in the X direction.

Figure 26:
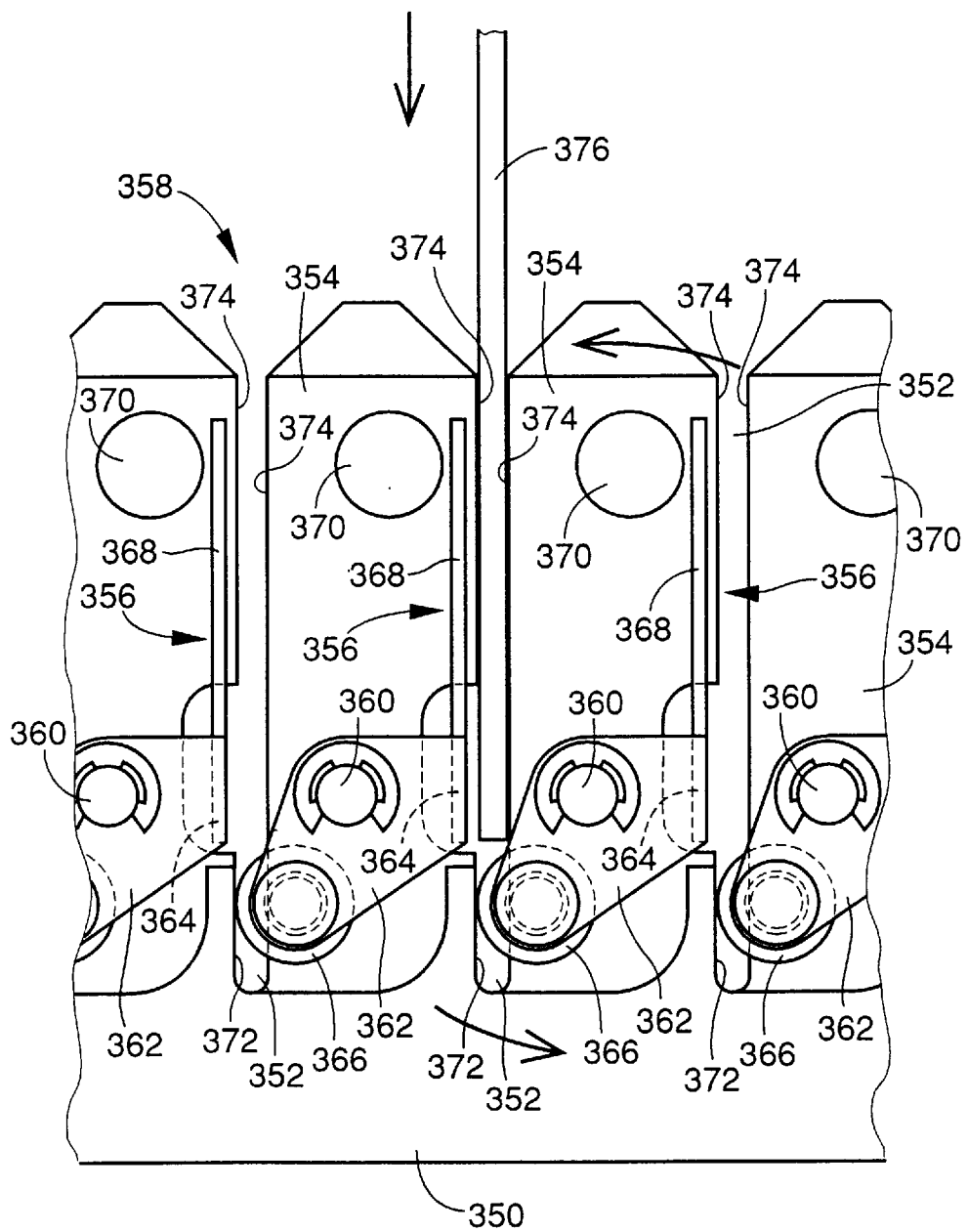
FIG. 26 is a side view of a portion of an engaging device of another electronic-component supplying system as a fourth embodiment of the present invention.

FIG. 26 shows an engaging device 358 of another electronic-component supplying system as a fourth embodiment of the present invention. The supplying system in accordance with the fourth embodiment is different from the supplying system shown in FIG. 1 only in that the former system employs the engaging device 358 in place of the engaging device 206 employed in the latter system. However, the engaging device 358 has, like the engaging device 206, two rotatable engagement members 356 (only rear engagement member 356 is shown) which are respectively provided in front and rear of each of a number of wall members 354 which are formed in a fixed stop member 350 and define a number of engagement grooves 352. Each rotatable engagement member 356 is formed of a spring sheet and includes a lever 362 which is supported by an axis member 360 extending in the Y direction, such that the lever 362 is rotatable about the axis member 360. The respective levers 362 of the front and rear rotatable members 356 are connected by a connection portion 364, and are rotatable as a unit.

An engagement roller 366 is attached to a lower portion of each rotatable engagement member 356 below the axis member 360 of the lever 362 thereof, such that the roller 366 is rotatable about an axis line extending in the Y direction. A belt-like arm portion 368 projects upward from the lever 362. Two engagement projections 370 each having a circular cross section project from a front and a rear surface of each wall member 354, respectively. While an electronic-component holder 54 is not engaged with the fixing device 358, each engagement roller 366 is held in contact with a stop surface 372 and the arm portion 368 is positioned away from the corresponding engagement projection 370.

When an electronic-component supplying cartridge 26 is attached to a support table 24, an engagement member 376 of a reel holder 52 is engaged with one of the engagement grooves 352. As the engagement member 376 enters the engagement groove 352, the engagement member 376 engages the engagement roller 366, thereby rotating the lever 356 in a direction in which the roller 366 is moved away from the engagement groove 352. Consequently the arm portion 368 abuts on the engagement projection 370. When the engagement member 376 goes further into the engagement groove 352, the arm portion 368 is elastically deformed and the roller 366 elastically presses the member 376 against a side wall 374 of an adjacent wall member 354. Thus, the EC holder 54 is made immovable in the X direction.

Figure 27:
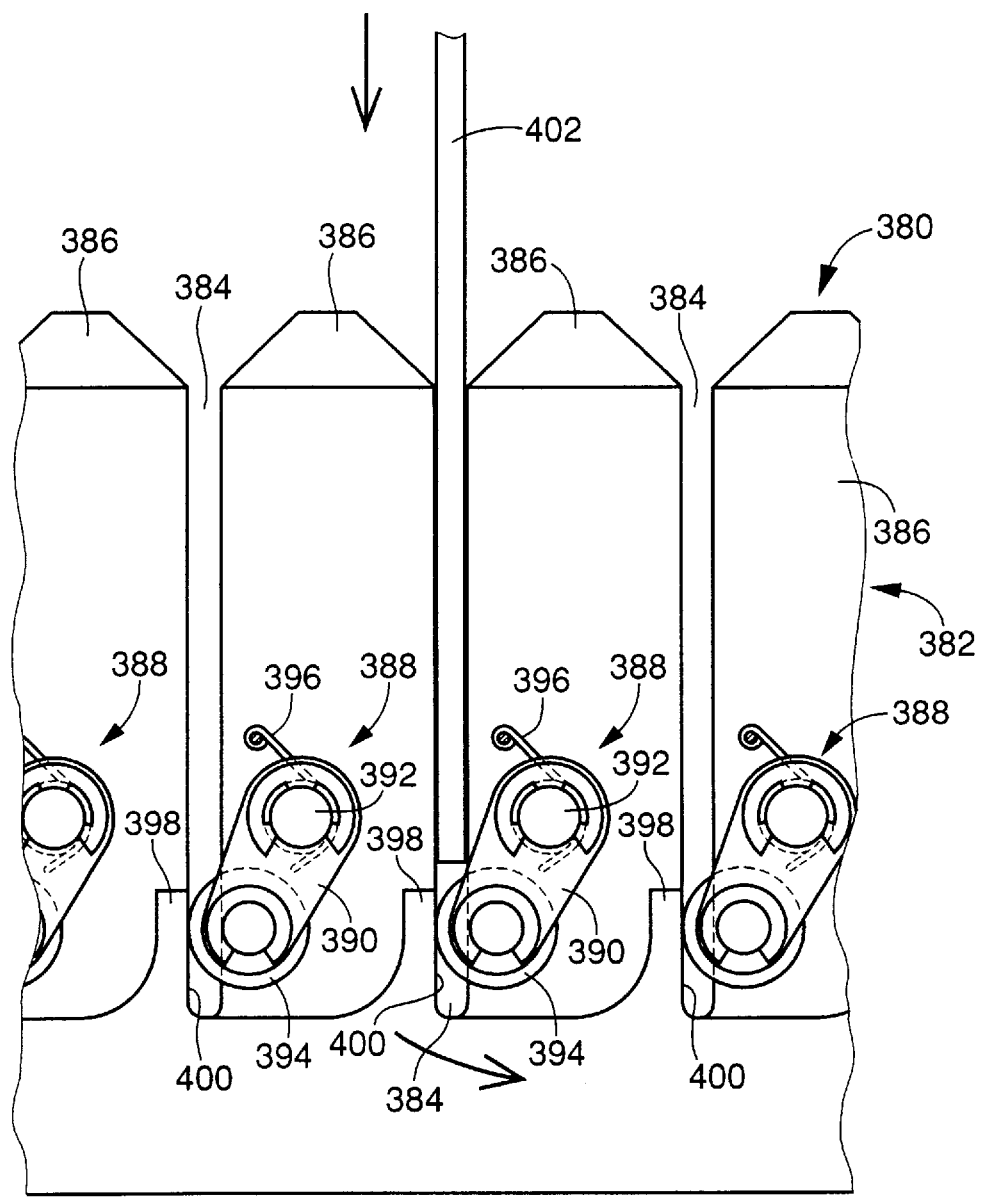
FIG. 27 is a side view of a portion of an engaging device of another electronic-component supplying system as a fifth embodiment of the present invention.
Figure 28:
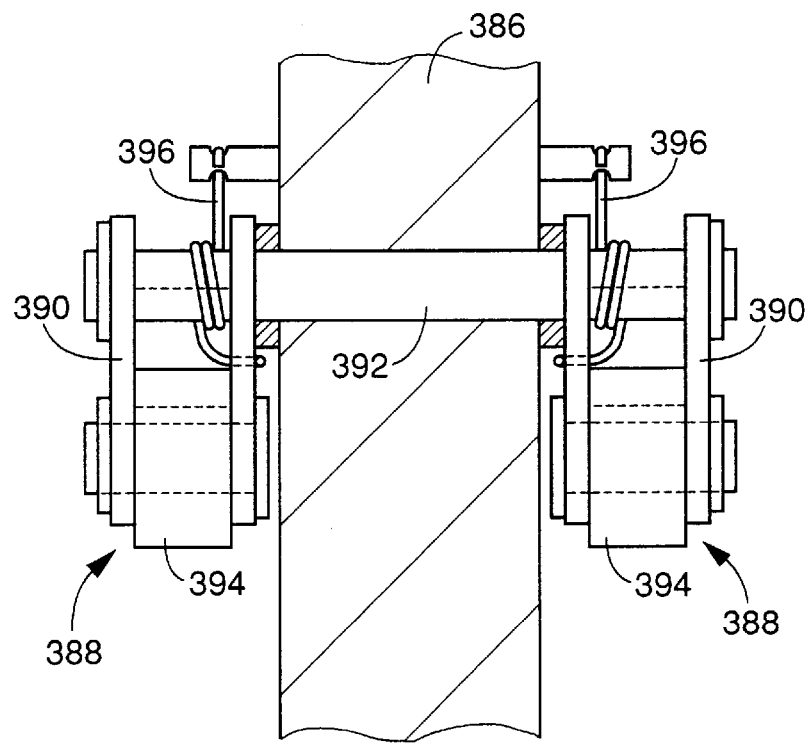
FIG. 28 is a side cross-section view of the engaging device of FIG. 27.

FIGS. 27 and 28 show an engaging device 380 of another electronic-component supplying system as a fifth embodiment of the present invention. The supplying system in accordance with the fifth embodiment is different from the supplying system shown in FIG. 1 only in that the former system employs the engaging device 380 in place of the engaging device 206 employed in the latter system. However, the engaging device 380 has, like the engaging device 206, two rotatable engagement members 388 (only rear engagement member 388 is shown) which are respectively provided in front and rear of each of a number of wall members 386 which are formed in a fixed stop member 382 and define a number of engagement grooves 384. As shown in FIG. 28, each rotatable engagement member 388 includes a lever 390 which is provided by two plate members which are spaced from each other in the Y direction and are connected to each other. The two levers 390 are attached to opposite two ends of an axis member 392 fixed to the wall member 386, such that the levers 390 are rotatable as a unit about the axis member 392. An engagement roller 394 is rotatably attached to a free end portion of the lever 390. A torsion spring 396 is wound around the axis member 392 such that one end of the spring 396 is fixed to the wall member 386 and the other end of the same 396 is fixed to the lever 390. Thus, the engagement roller 394 is biased in a direction toward a stop surface 400 of a stop projection 398.

When an electronic-component supplying cartridge 26 is attached to a support table 24, an engagement member 402 of a reel holder 52 is engaged with one of the engagement grooves 384. As the engagement member 402 enters the engagement groove 384, the engagement member 402 engages the engagement roller 394, thereby rotating the lever 396 against the biasing force of the torsion spring 396 in a direction in which the roller 394 is moved away from the stop surface 400. Because of the reaction force of the torsion spring 396, the engagement member 402 is pressed against the stop surface 400, so that the EC holder 54 is prevented from being moved in the X direction.

Figure 29:
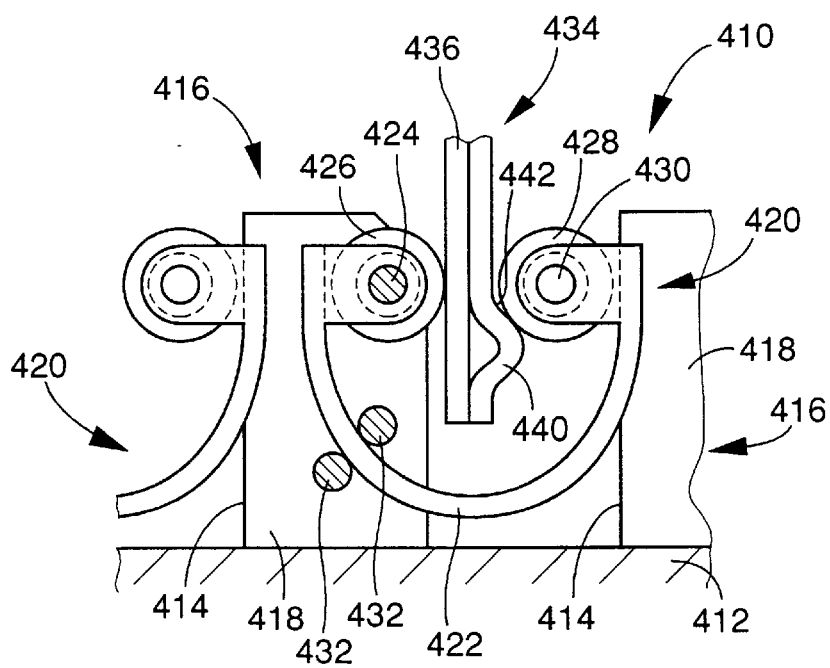
FIG. 29 is a side view of a portion of an engaging device of another electronic-component supplying system as a sixth embodiment of the present invention.

FIG. 29 shows an engaging device 410 of another electronic-component supplying system as a sixth embodiment of the present invention. The supplying system in accordance with the sixth embodiment is different from the supplying system shown in FIG. 1 in that the former system employs the engaging device 410 in place of the engaging device 206 employed in the latter system and that the former system does not employ the cartridge pressing device provided by the engaging lever 134, coil spring 148, etc. shown in FIG. 3. In the sixth embodiment, a stop roller 426 is provided as a stop member for defining a limit of movement of an electronic-component holder 54 because of a biasing force of a lever 422 as a biasing member. The engaging device 410 includes a stop member 412 which has a number of wall members 416 defining a number of engagement grooves 414 which are equidistant from one another and each of which extend in the Y direction. A receiving groove 418 is formed through the wall members 416 in the X direction. Thus, each wall member 416 is divided into a front and a rear portion.

A rotatable engagement member 420 which is formed of a spring sheet is provided in the receiving groove 418. The engagement member 420 includes a lever 422 which has a generally semi-annular configuration. One end of the lever 422 is supported by an axis member 424 which extends in the Y direction and whose opposite ends are supported by the front and rear portions of the wall member 416. A stop roller 426 is rotatably attached to the axis member 424.

An engagement roller 428 is attached to the other end of the lever 422 via an axis member 430 extending in the Y direction, such that the roller 428 is rotatable about the axis member 430. A portion of an outer surface of the engagement roller 428 is provided by a part-spherical surface. A pair of pins 432 which are supported by the front and rear portions of the wall member 416 cooperate with each other to sandwich a portion of the lever 422 which is distant by a predetermined distance from the axis member 424, such that the length of the lever 422 between the axis member 424 and the pins 432 is immovable. Thus, one end portion of the lever 422 is fixed to the wall member 416 at the two positions distant from each other, and the other end portion of the same 422 supports the engagement roller 428.

In the sixth embodiment, an electronic-component holder 54 in the form of a reel holder 434 includes an engagement portion 436. The engagement portion 436 is provided by welding respective projecting portions of two thin plate members to each other. The two thin plate members are those which cooperate with each other to provide the reel holder 434. One of the two projecting portions is flat and the other projecting portion includes an engagement projection 440 having a generally semi-circular cross section. The engagement projection 440 has an upper, inclined surface 442 which is inclined obliquely between an upward direction and a direction away from the engagement roller 428. The engagement projection 440 is inclined obliquely between in an upward direction and a direction from a rear portion of the EC holder 54 toward a front portion of the same 54. Accordingly, the upper inclined surface 442 is inclined in the same direction as that of inclination of the projection 440.

When an electronic-component supplying cartridge 26 is attached to a support table 24, the engagement portion 436 enters the engagement groove 414, between the stop and engagement rollers 426, 428, so that the engagement projection 440 elastically deforms the lever 422 in a direction in which the engagement roller 428 is moved away from the stop roller 426. After the roller.428 climbs over the projection 440, the roller 428 engages the upper inclined surface 442 of the projection 440. Consequently the engagement roller 428 presses the engagement portion 436 against the stop roller 426, thereby preventing the EC holder 54 from being moved in the X direction. In addition, the engagement of the engagement roller 428 and the inclined surface 442 results in biasing the engagement portion 436 in not only a downward direction but also a frontward direction. Accordingly, as shown in FIG. 3, a cartridge-side inclined surface 84 and a table-side inclined surface 114 are engaged with each other, so that a cartridge frame 50 is pressed on support surfaces 104, 105 of the support table 24. Thus, the supplying cartridge 26 is pressed downward by the engaging device 410 which also functions as the cartridge pressing device and thereby contributes to simplifying the overall construction of the present electronic-component supplying system.

Figure 30:
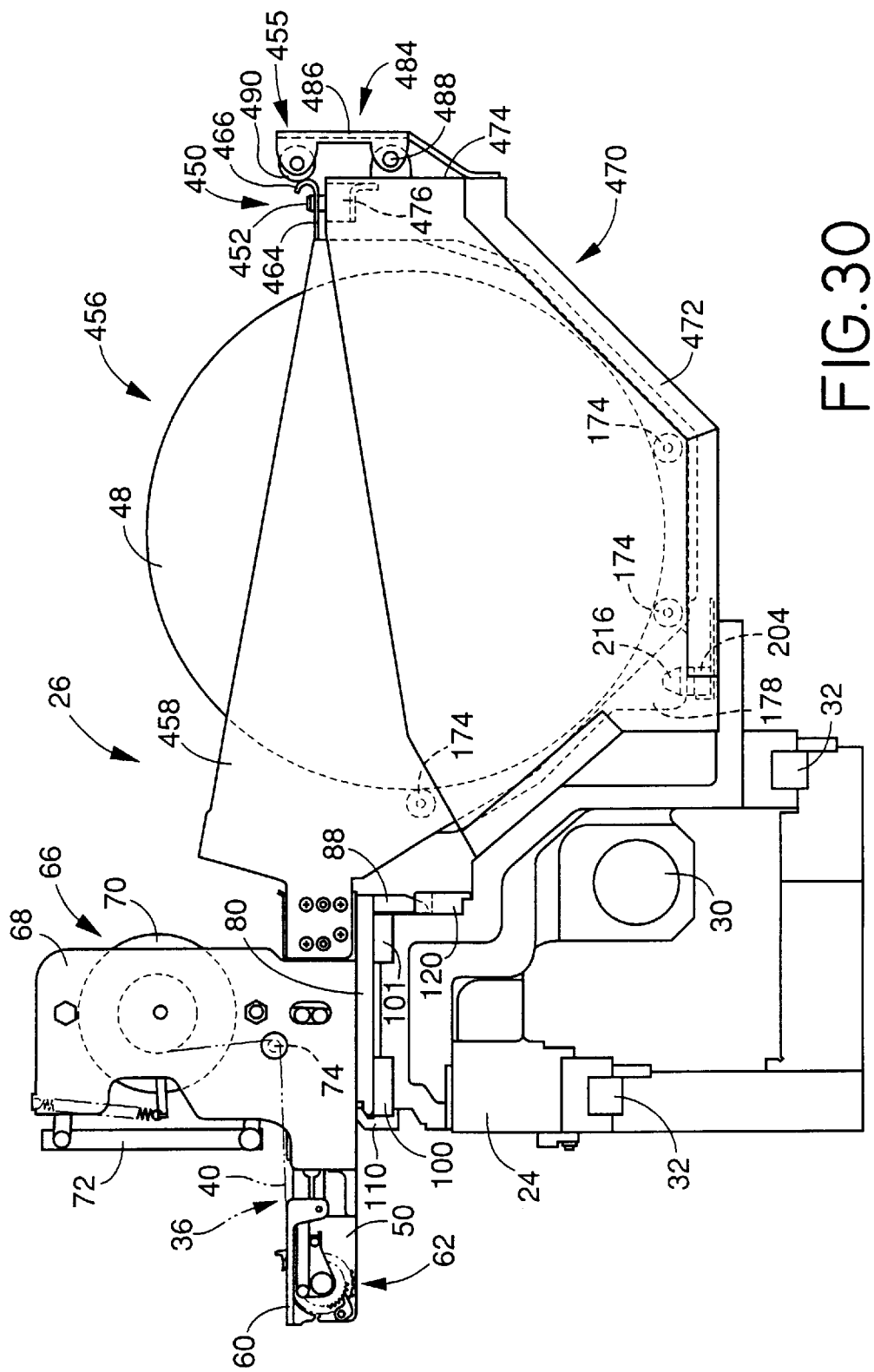
FIG. 30 is a side view of another electronic-component supplying system as a seventh embodiment of the present invention.
Figure 31:
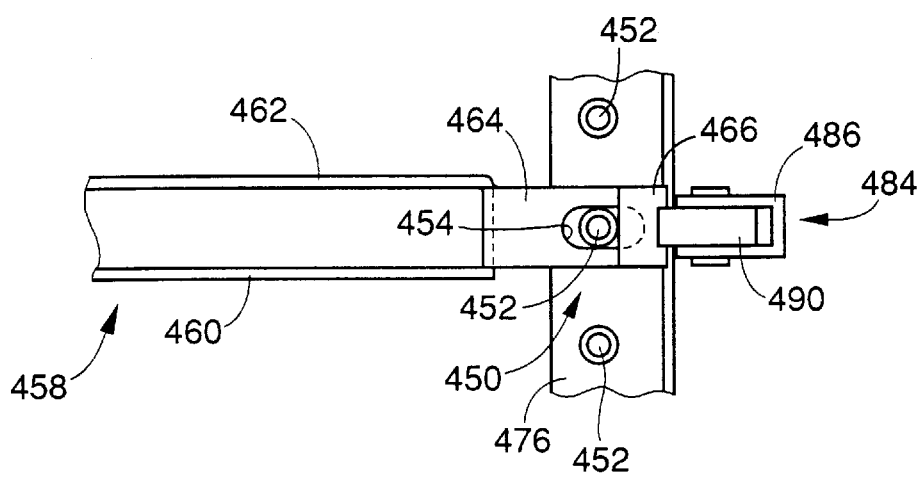
FIG. 31 is a plan view for illustrating the state in which an electronic-component holder is engaged with an engaging device of the supplying system of FIG. 30.

FIGS. 30 and 31 show another electronic-component supplying system as a seventh embodiment of the present invention. The supplying system in accordance with the seventh embodiment is different from the supplying system shown in FIG. 1 in that the former system employs an engaging device 450 in place of the engaging device 206 employed in the latter system and that the former system employs a cartridge pressing device 455 provided adjacent to the engaging device 450. The engaging device 450 is provided by an engagement pin 452 and an elongate hole 454. The same reference numerals as used in FIGS. 1 through 23 are used to designate the corresponding elements or parts of the seventh embodiment shown in FIGS. 30 and 31, and the description of those elements or parts is omitted.

Like the reel holder 52 of the first embodiment, a reel holder 458 as an electronic-component holder 456 of an electronic-component supplying cartridge 26 is provided by a first and a second plate-like wall member 460, 462 which are welded to each other. A plate-like engagement member 464 projects rearward and horizontally from a rear and upper end of the second wall member 462. The engagement member 464 includes, as a free end portion thereof, a part-cylindrical engagement portion 466 which projects rearward. The engagement member 464 has an elongate hole 454 which is formed through the thickness thereof and is elongate in the Y direction.

An elongate stop member 476 is fixed to an inner surface of a rear wall 474 of a bucket 472 of an electronic-component-holder supporting device 470 of a support table 24. A number of engagement pins 452 projects upward from the base member 476, such that the pins 452 are positioned at regular intervals of distance in the X direction. Each pin 452 has a tapered top portion whose diameter gradually decreases. The tapered top portion of each pin 452 functions as a guide for guiding the elongate hole 454 of the engagement member 464 so that the hole 454 engages the pin 452.

A pressing device 484 is supported by an outer surface of the rear wall 474. The pressing device 484 includes a lever 486 which is formed of a spring sheet and which is attached at an lengthwise intermediate portion thereof to an axis member 488 extending in the X direction, such that the lever 486 is rotatable about the axis member 488. An engagement roller 490 is attached to an upper end portion of the lever 486, such that the roller 490 is rotatable about an axis line parallel to the X direction. A lower end portion of the lever 486 is bent and is abutable on the rear surface of the rear wall 474.

When the cartridge 26 is attached to the support table 24, first and second positioning projections 82, 83, 88 are engaged with first and second positioning grooves 102, 103, 122, and the elongate hole 454 of the engagement member 464 of the EC holder 456 is engaged with one of the engagement pins 452. The elongate hole 454 has a width substantially equal to the diameter of a non-tapered portion of the pin 452. Therefore, with the hole 454 and the pin 452 being engaged with each other, the rear end portion of the reel holder 458 is prevented from being moved in the X direction.

Simultaneously, the engagement portion 466 of the engagement member 464 is engaged with the engagement roller 490, thereby elastically deforming the lever 486 in a direction in which the roller 490 is moved away from the engagement pin 452. Because of the reaction force of the deformed lever 486, the engagement member 464 is biased in frontward and downward directions, so that a cartridge-side inclined surface 84 is pressed against a table-side inclined surface 114 and a cartridge frame 50 is pressed on support surfaces 104, 105. Thus, the cartridge frame 50 is clamped on the support table 24.

While the present invention has been described in its preferred embodiments, it is to be understood that the present invention may otherwise be embodied.

For example, in the first embodiment shown in FIGS. 1 to 23, the rotatable engagement members 254 may be omitted, and the engagement grooves 238 may intentionally be misaligned by an appropriate amount relative to the engagement members 184 of the reel holders 52, in the X direction, so that with the members 254 and the grooves 238 being engaged with each other, each reel holder 52 may elastically be deformed by an appropriate amount which does not result in failing to hold a tape reel 48. When the cartridge 26 is attached to the support table 24 while being positioned in the X direction because of the engagements of the positioning projections 82, 83, 88 with the positioning grooves 102, 103, 122, the engagement member 184 of the reel holder 52 of the cartridge 26 takes a position where the engagement member 184 is misaligned by a predetermined amount in a predetermined direction with respect to a corresponding one of the engagement grooves 238 and is interferable with a corresponding one of the wall members 240. In this case, as the engagement member 184 enters the engagement groove 238, the reel holder 52 is elastically deformed, so that owing to the reaction force of the reel holder 52 being deformed, the engagement member 184 is elastically pressed against the side surface 244 of an adjacent wall member 240. The amount of misalignment of the engagement member and groove 184, 238 and the elastic coefficient of the reel holder 52 are so pre-determined that the above-mentioned pressing force of the deformed reel member 52 may be greater than the inertia force of the reel member 52 and the carrier tape 36 held therein that is produced when the movement of the support table 24 is started or stopped. Accordingly, the vibration of the EC holder 54 in the X direction is effectively prevented. It is preferred that the amount of misalignment of the engagement member and groove 184, 238 be so pre-determined as to satisfy the above-mentioned condition even if different engagement members 184 may have different thickness values falling within a predetermined range or even if the respective elements of the electronic-component supplying system 10 may have some manufacturing errors. However, even though the pressing force with which the engagement member 184 is pressed against the wall surface 244 may be smaller than the inertia force of the holding device 54 and the carrier tape 36, the vibration of the holding device 54 is reduced to an appreciable level, so long as the engagement member 184 is pressed against the wall member 240.

In the above-described embodiment, the reel holder 52 including the engagement member 184 may be formed of an elastic or spring material, or alternatively only the engagement member 184 may be formed of the material. However, the reel holder 52 or the engagement member 184 may not be formed of the material, because a reel holder 52 having a sufficiently long dimension in the Y direction relative to a dimension thereof in the X direction may elastically be deformed by a sufficient amount.

Moreover, the stop roller 426 shown in FIG. 29 may be provided on the side surface 244 of the wall member 240, to facilitate the engagement and disengagement of the engagement member 184 with and from the engaging device constructed as described above.

In the illustrated embodiments, the cooperation of the engaging device (e.g., 206) and the EC-holder support member 204 effectively prevents the vibration of the reel holder 52. Accordingly, the support device 204 does not include any engaging device. However, the support device 204 may include another engaging device. In the latter case, two engaging devices are provided at two positions which are distant from each other both in the Y direction parallel to the EC feeding direction, and a vertical direction perpendicular to the X direction and the EC feeding direction. Thus, the movement of the reel holder 52 as the EC holder 54 in the X direction is prevented at a plurality of positions and accordingly the vibration of the reel holder 52 is minimized.

Furthermore, in the first embodiment shown in FIGS. 1 to 23, it is possible to provide immovable stop rollers at positions opposed to the positions where the first and second engagement rollers 264, 272 are provided. In the latter case, the two pairs of rollers cooperate with each other to sandwich the engagement member 184 in the X direction, thereby avoiding the friction otherwise produced when the engagement member 184 is engaged with, and disengaged from, the side surface 244 of the wall member 240. Thus, the engagement and disengagement of the engagement member 184 with and from the engaging device 206 is facilitated.

In the first embodiment shown in FIG. 19, the engagement member 184 may be made shorter such that with the supplying cartridge 60 being attached to the support table 24, the engagement member 184 engages the second engagement roller 272 of the rotatable engagement member 254 but does not engage the first engagement roller 264 of the same 254. In the latter case, the spacing between the side wall 244 and the first or second roller 264, 272 is reduced to a considerably small value or even zero. When the engagement member 184 is fit in the engagement groove 238, only the second roller 272 engages the engagement member 184 and the lever portion 268 is elastically deformed, so that the first roller 264 is pressed against the stop surface 248 of the stop projection 242. In this case, too, the EC holder 54 is effectively prevented from being moved in the X direction.

In addition, in the seventh embodiment shown in FIGS. 30 and 31, it is possible that the lever 486 of the pressing device 484 be formed of a common structural steel or the like and be biased by an elastic member such as a spring, so that the engagement roller 490 is engaged with the engagement portion 466 of the engagement member 464.

In each of the illustrated embodiments, the electronic-component supplying system 10 supplies electronic components to the electronic-component mounting device 12 which includes the index table 14 rotatable about an axis line and the component-suction heads 20 supported by the index table 14. However, the supplying system 10 may be used with other sorts of electronic-component mounting devices, such as a device including one or more component-suction heads each of which is movable in one direction or two orthogonal directions in a horizontal plane, picks up by air suction each of electronic components, and mounts the components on an object, or a device including one or more component-suction heads each of which is immovable or fixed in position.

The support table 24 may be adapted to be movable in two orthogonal directions in a horizontal plane, for example, both in the X and Y directions shown in FIG. 1, or otherwise may be adapted to be immovable.

The principle of the present invention is applicable to other sorts of electronic-component supplying cartridges than the cartridge 26 employed in the illustrated embodiments, for example, a cartridge which includes a box accommodating a carrier tape carrying electronic components and which intermittently draws, out of the box, the carrier tape by one pitch and supplies the carrier tape to the electronic-component mounting device 12. Moreover, the cartridge 26 may be replaced by a cartridge including a casing in which electronic components are arranged in an array along a straight line, and including a vibrator which vibrates the casing and thereby moves and feeds each component toward the mounting device 12.

The present invention may be embodied by changing one or more of the combined individual elements of each of the illustrated embodiments, with one or more of those of another or others of the illustrated embodiments.

It is to be understood that the present invention may be embodied with other changes, improvements, and modifications that may occur to those skilled in the art without departing from the scope and spirit of the invention defined in the appended claims.

What is claimed is:

1. An electronic-component supplying system comprising:

a plurality of electronic-component supplying cartridges each of which includes a cartridge frame which includes a connection portion, an electronic-component holder which holds a plurality of electronic components and which comprises a plate member separate from said cartridge frame and including a connection portion, a connecting device which connects said connection portion of said plate member of said holder and said connection portion of said cartridge frame to each other, and an electronic-component feeder which feeds each of said electronic components from said holder to an electronic-component supplying position distant from said connection portion of said cartridge frame;

a support member which supports the respective cartridge frames of said supplying cartridges such that the respective electronic-component supplying positions on said cartridge frames are aligned with each other in a predetermined direction; and at least one engaging device which is provided between said support member and at least one engageable portion of said holder of said each cartridge, said engageable portion of said holder being distant from said connection portion of said plate member thereof, said engaging device being engageable with said engageable portion of said holder such that said engageable portion is substantially immovable relative to said support member in said predetermined direction.

2. An electronic-component supplying system according to claim 1, wherein said engaging device comprises two engageable members which are engageable with opposite two surfaces in said predetermined direction of said engageable portion of said holder of said each cartridge, respectively, one of said two engageable members comprising a movable member which is movable relative to said support member in said predetermined direction, said engaging device further comprising a biasing member which provides a biasing force to bias said movable member toward said engageable portion of said holder, the other of said two engageable members comprising a stopper surface which is fixed to said support member and which stops a movement of said engageable portion of said holder due to said biasing force of said biasing member applied thereto via said movable member and thereby defines a limit of said movement of said engageable portion.

3. An electronic-component supplying system according to claim 2, wherein said movable member comprises a rotatable member including opposite two end portions and an intermediate portion which is formed of an elastic material and which is supported by said support member such that said intermediate portion is rotatable about an axis line substantially perpendicular to said predetermined direction, said two end portions of said rotatable member providing a first and a second engageable portion, said intermediate portion of said rotatable member being elastically deformed when said first and second engageable portions engage said engageable portion of said holder, said biasing member comprising said intermediate portion of said rotatable member.

4. An electronic-component supplying system according to claim 3, wherein each of said first and second engageable portions comprises a roller which is rotatable about an axis line substantially perpendicular to both said predetermined direction and a direction in which said holder of said each cartridge is moved relative to said support member when said each cartridge is attached to the support member.

5. An electronic-component supplying system according to claim 2, wherein said movable member comprises a rotatable member which is supported by said support member such that said rotatable member is rotatable about an axis line substantially perpendicular to said predetermined direction.

6. An electronic-component supplying system according to claim 2, wherein said movable member comprises a rotatable member including an elastic portion which is formed of an elastic material and which is supported by said support member such that said elastic portion is rotatable about an axis line substantially perpendicular to said predetermined direction, said rotatable member further including a first and a second engageable portion distant from said elastic portion, said elastic portion being elastically deformed when said first engageable portion engages said engageable portion of said holder and said second engageable portion engages a stopper portion of said support member.

7. An electronic-component supplying system according to claim 2, wherein said movable member comprises a rotatable member which is supported by said support member such that said rotatable member is rotatable about an axis line substantially perpendicular to said predetermined direction, said rotatable member including an engageable end portion which is engageable with said engageable portion of said holder, said biasing member comprising an elastic member which is provided between said rotatable member and said support member and which elastically presses said engageable end portion of said rotatable member against said engageable portion of said holder when the engageable end portion of the rotatable member engages the engageable portion of the holder.

8. An electronic-component supplying system according to claim 2, wherein said movable member comprises at least one linearly movable member which is supported by said support member such that said linearly movable member is movable substantially linearly in said predetermined direction.

9. An electronic-component supplying system according to claim 2, wherein said engaging device comprises an engageable groove which extends in a direction substantially perpendicular to said predetermined direction and which is engageable with said engageable portion of said holder of said each cartridge, said engageable groove being formed in a portion of said support member which corresponds to said engageable portion of said holder distant from said connection portion thereof connected to said connection portion of said cartridge frame of said each cartridge.

10. An electronic-component supplying system according to claim 9, wherein said engaging device comprises two wall members which cooperate with each other to define said engageable groove, said movable member being supported by one of said two wall members, said stopper surface being provided on the other of said two wall members.

11. An electronic-component supplying system according to claim 10, wherein said engaging device comprises said movable member and an additional movable member which are provided, outside said engageable groove, adjacent to opposite two ends of the engageable groove, respectively.

12. An electronic-component supplying system according to claim 11, wherein at least one of said wall members has a hole which opens in said engageable groove and which accommodates said two movable members and said biasing member.

13. An electronic-component supplying system according to claim 2, wherein said engageable portion of said holder has an engageable surface which is engageable with said movable member and which is inclined with respect to a direction in which said movable member is biased by said biasing member, and wherein a direction of the inclination of said engageable surface is selected such that when said movable member engages said engageable surface, said biasing force of said biasing member provides, via the movable member and the engageable surface, a force to press said each cartridge against said support member in a direction substantially perpendicular to said predetermined direction.

14. An electronic-component supplying system according to claim 1, wherein said engaging device comprises an engageable projection which is provided on one of said support member and said each cartridge and which extends in a direction in which said holder of said each cartridge is moved relative to the support member when said each cartridge is attached to the support member, and comprises an engageable recess which is provided in the other of said support member and said each cartridge and which is engageable with said engageable projection such that the engageable projection and recess are substantially immovable relative to each other in said predetermined direction.

15. An electronic-component supplying system according to claim 14, wherein said engageable recess of said engaging device comprises an elongate hole which is elongate in a direction perpendicular to said predetermined direction.

16. An electronic-component supplying system according to claim 1, wherein the supplying system comprises a plurality of said engaging devices which are provided, between said support member and said at least one engageable portion of said holder of said each cartridge, at a plurality of positions, respectively, which are distant from each other on said support member in a direction parallel to a direction in which said feeder of said each cartridge feeds said each electronic component from said holder thereof to said electronic-component supplying position on said cartridge frame thereof.

17. An electronic-component supplying system according to claim 1, wherein the supplying system comprises a plurality of said engaging devices which are provided at a plurality of positions, respectively, which are distant from each other on said support member in a direction perpendicular to a direction in which said feeder of said each cartridge feeds said each electronic component from said holder thereof to said electronic-component supplying position on said cartridge frame thereof.

18. An electronic-component supplying system according to claim 1, wherein said holder of said each cartridge comprises a reel holder which holds a tape reel around which a carrier tape carrying said electronic components at a regular interval of distance is wound, such that the tape reel is rotatable about an axis line parallel to said predetermined direction.

19. An electronic-component supplying system according to claim 1, further comprising a moving device which moves said support member supporting said cartridges, in said predetermined direction.

20. An electronic-component supplying system according to claim 19, wherein said moving device comprises means for moving said support member in said predetermined direction perpendicular to a direction in which said feeder of said each cartridge feeds said each electronic component from said holder thereof to said electronic-component supplying position on said cartridge frame thereof.

21. An electronic-component supplying system according to claim 1, wherein said cartridge frame of said each cartridge comprises one of an engageable projection and an engageable groove which is engageable with said engageable projection and extends in a direction perpendicular to said predetermined direction, and said support member comprises the other of said engageable projection and said engageable groove.

22. An electronic-component supplying system according to claim 1, further comprising a preventing device which prevents said cartridge frame of said each cartridge from moving away from said support member.

23. An electronic-component supplying system according to claim 1, wherein said at least one engageable portion of said electronic-component holder of said each cartridge is more distant from said electronic-component supplying position on said cartridge frame of said each cartridge, than said connection portion of said holder connected to said connection portion of said cartridge frame, in a direction in which said electronic-component feeder of said each cartridge feeds said each electronic component from said holder to said electronic-component supplying position.

24. An electronic-component supplying system according to claim 1, wherein said connecting device comprises an attachment member which projects from said connection portion of said plate member of said electronic-component holder of said each cartridge and which is fixed to said connection portion of said cartridge frame of said each cartridge.

25. An electronic-component supplying system comprising:

a plurality of electronic-component supplying cartridges each of which includes a cartridge frame which includes a connection portion, an electronic-component holder which holds a plurality of electronic components and which comprises a plate member separate from said cartridge frame and including a connection portion, a connecting device which connects said connection portion of said plate member of said holder and said connection portion of said cartridge frame to each other, and an electronic-component feeder which feeds each of said electronic components from said holder to an electronic-component supplying position distant from said connection portion of said cartridge frame;

a support member which supports the respective cartridge frames of said supplying cartridges such that the respective electronic-component supplying positions on said cartridge frame are aligned with each other in a predetermined direction; and at least one engaging device which is provided between said support member and at least one engageable portion of said holder of said each cartridge, said engageable portion of said holder being substantially most distant from said connection portion of said plate member thereof, said engaging device being engageable with said substantially most distant engageable portion of said holder such that said engageable portion is substantially immovable relative to said support member in said predetermined direction.

* * * * *